(12) United States Patent
Hwang et al.

(10) Patent No.: US 7,942,623 B2
(45) Date of Patent: May 17, 2011

(54) SUBSTRATE SUPPORTING MEANS HAVING WIRE AND APPARATUS USING THE SAME

(75) Inventors: Chul-Joo Hwang, Gyeonggi-do (KR); Sang-Do Lee, Gyeonggi-do (KR)

(73) Assignee: Jusung Engineering Co. Ltd., Gwangju-si, Gyeonggi-do (KR)

( * ) Notice: Subject to any disclaimer, the term of this patent is extended or adjusted under 35 U.S.C. 154(b) by 0 days.

(21) Appl. No.: 12/824,956

(22) Filed: Jun. 28, 2010

(65) Prior Publication Data

US 2010/0260589 A1 Oct. 14, 2010

Related U.S. Application Data

(62) Division of application No. 11/039,505, filed on Jan. 19, 2005, now Pat. No. 7,771,538.

(30) Foreign Application Priority Data

Jan. 20, 2004 (KR) .................. 10-2004-0004294
Apr. 1, 2004 (KR) .................. 10-2004-0022648
Jan. 7, 2005 (KR) .................. 10-2005-0001505

(51) Int. Cl.
*H01L 21/677* (2006.01)
*C23C 16/00* (2006.01)
*C23F 1/00* (2006.01)

(52) U.S. Cl. ............... 414/806; 427/255.28; 427/534; 427/535; 216/67

(58) Field of Classification Search .............. 118/728; 156/345.51; 216/67; 414/806; 427/255.28, 427/534–535

See application file for complete search history.

(56) References Cited

U.S. PATENT DOCUMENTS

| | | | |
|---|---|---|---|
| 3,887,396 | A | 6/1975 | Walsh et al. |
| 5,011,023 | A | 4/1991 | Arai |
| 5,874,127 | A | 2/1999 | Winterton et al. |
| 5,993,302 | A | 11/1999 | Chen et al. |
| 6,106,631 | A | 8/2000 | Inoue et al. |
| 6,405,622 | B1 | 6/2002 | Balz et al. |

FOREIGN PATENT DOCUMENTS

| | | |
|---|---|---|
| JP | 61027653 | 2/1986 |
| JP | 61-194844 | 8/1986 |

*Primary Examiner* — Michael Cleveland
*Assistant Examiner* — Nathan K Ford
(74) *Attorney, Agent, or Firm* — Portland IP Law LLC

(57) ABSTRACT

An apparatus includes: a process chamber for treating a substrate; a susceptor in the process chamber; a supporting frame over the susceptor; and at least one wire connected to the supporting frame.

20 Claims, 34 Drawing Sheets

SUBSTRATE SUPPORTING MEANS HAVING WIRE AND APPARATUS USING THE SAME

CROSS-REFERENCE TO RELATED APPLICATION

This application is a Divisional Application of U.S. application Ser. No. 11/039,505, filed Jan. 19, 2005, which claims priority to Korean Patent Applications No. 2004-0004294 filed in Korea on Jan. 20, 2004, No. 2004-0022648 filed in Korea on Apr. 1, 2004 and No. 2005-0001505 filed in Korea on Jan. 7, 2005, each of which is hereby incorporated by reference in their entirety.

BACKGROUND OF THE INVENTION

1. Field of the Invention

The present invention relates to an apparatus of fabricating a semiconductor device, and more particularly, to a substrate supporting means for a plasma apparatus of fabricating a liquid crystal display device.

2. Discussion of the Related Art

Flat panel display (FPD) devices having portability and low power consumption have been a subject of increasing research in the present information age. Among the various types of FPD devices, liquid crystal display (LCD) devices are commonly used in notebook and desktop computers because of their high resolution, capability of displaying colored images, and high quality image display.

In general, an LCD device is a non-emissive device having an array substrate, a color filter substrate and a liquid crystal layer interposed between the array substrate and the color filter substrates, and displaying images by making use of optical anisotropy properties of the liquid crystal layer. In addition, an LCD device is fabricated by repeating a deposition step of a thin film on a substrate, a photolithographic step using a photoresist, a selective etching step of the thin film and a cleaning step of the substrate. These steps for a fabrication process of an LCD device may be performed using an apparatus having a process chamber under an optimum condition. A plasma apparatus where source gases are excited to radicals of a plasma state by a high frequency power is used for deposition, etching and cleaning steps of an LCD device. Recently, a plasma enhanced chemical vapor deposition (PECVD) apparatus has been widely used as a plasma apparatus.

FIG. 1 is a schematic cross-sectional view showing a plasma apparatus for a liquid crystal display device according to the related art. In FIG. 1, a plasma apparatus includes a process chamber 100 having a lid 112 and a chamber body 114. A gas inlet pipe 122 is formed through a middle portion of the lid 112 and a backing plate (not shown) under the lid 112. A shower head 120 having a plurality of through holes (not shown) is formed under the backing plate. Accordingly, source gases are injected to the shower head 120 through the gas inlet pipe 122 and are dispersed into a space over a susceptor 130 in the process chamber 100 through the plurality of through holes. Since a gas dispersion unit including the backing plate and the shower head 120 is connected to a high frequency (e.g., a radio frequency) power supply unit 124, the source gases are excited to have a plasma state. For example, the shower head 120 of the gas dispersion unit may function as an upper electrode to obtain a plasma state of the source gases. In addition, the chamber body 114 has a slot valve 146 for transferring a substrate "S."

The susceptor 130 is disposed in the chamber body 114. After a substrate "S" is transferred into the process chamber 100, the substrate "S" is placed on the susceptor 130. A heater (not shown) for heating the substrate "S" during a fabrication process is formed in the susceptor 130 and is connected to an external power source (not shown). For example, the susceptor 130 may function as a lower electrode to obtain a plasma state of the source gases. A susceptor-supporter 134 extends from a rear central portion of the susceptor 130 and a susceptor driving unit 144 such as a motor is connected to the susceptor-supporter 134 to move up and down the susceptor 130. In addition, a gas outlet pipe 142 is formed through a bottom portion of the chamber body 114. The gas outlet pipe 142 is connected to a vacuum pump (not shown) to evacuate residual gases and particles in the process chamber 100 after the fabrication process.

A plurality of lift pins 150 are formed to penetrate the susceptor 130 perpendicularly. The substrate "S" is supported by the plurality of lift pins 150 while the substrate "S" is transferred from a robot arm (not shown) to the susceptor 130 before the fabrication process and from the susceptor 130 to the robot arm after the fabrication process. Accordingly, the susceptor 130 moves up and down by the susceptor driving unit 144 while the substrate "S" is transferred into and out of the process chamber 100, and the plurality of lift pins 150 are protruded above and indented under a top surface of the susceptor 130. As a result, the substrate "S" is transferred from the plurality of lift pins 150 to the susceptor 130, and vice versa.

FIGS. 2A to 2C are schematic cross-sectional views showing a transfer process of a substrate in a plasma apparatus for a liquid crystal display device according to the related art. In FIG. 2A, a substrate "S" on a robot arm 160 is transferred into a process chamber 100 (of FIG. 1) and placed over a susceptor 130. A plurality of lift pins 150 is protruded above a top surface of the susceptor 130 through a plurality of lift pin holes 136, and a bottom surface of the substrate "S" is separated from the plurality of lift pin 150. Next, the substrate "S" contacts the plurality of lift pins 150 by moving down the robot arm 160.

In FIG. 2B, the robot arm 160 is returned to an exterior of the process chamber 100 (of FIG. 1) and the substrate "S" is supported by the plurality of lift pins 150 protruded above the top surface of the susceptor 130.

In FIG. 2C, since the susceptor 130 moves up by a susceptor driving unit 144 (of FIG. 1), the plurality of lift pins 150 relatively move down through a plurality of lift pin holes 136. Accordingly, the substrate "S" is placed on the top surface of the susceptor 130. The lift pin 150 has a greater diameter at an upper portion 150a than at the other portion to prevent complete separation of the lift pin 150 from the lift pin hole 136 of the susceptor 130. Similarly, the lift pin hole 136 also has a greater diameter at an upper portion 136a than at the other portion.

Even though not shown, the susceptor 130 having the substrate "S" thereon moves up to a reaction region of the process chamber 100 (of FIG. 1), and a thin film is formed on the substrate "S" due to source gases, a high frequency power and a heat. After the thin film is formed, the substrate "S" is supported by the plurality of lift pins 150 by moving down the susceptor 130. Next, the robot arm 160 is placed between the substrate "S" and the plurality of lift pins 150 and then the substrate "S" is transferred out of the process chamber 100 (of FIG. 1).

Since the plurality of lift pins are formed through the susceptor having a heater therein, the plurality of lift pins may be defected by a heat of the heater during a fabrication process. Specifically, lift pins adjacent to the heater may be easily broken due to a high temperature. Moreover, when the substrate is placed on the plurality of lift pins, the substrate may be defected by sliding over from a predetermined position. Recently, as a size of the substrate increases, more numbers of lift pins are required to support the substrate. When lift pins penetrating a central portion of the susceptor are defected, a corresponding central portion of the substrate is not supported, thereby the substrate warped or broken.

In addition, since the susceptor has a plurality of lift pin holes corresponding to the plurality of lift pins, a heat from the heater in the susceptor is released through the plurality of lift pin holes and is not completely transmitted to the substrate. Accordingly, an optimum fabrication process of a thin film is not obtained. Further, since a plasma density at a portion adjacent to the plurality of lift pin holes is different from that of the other portions, the thin film on the substrate have a non-uniform thickness. This non-uniform thickness of the thin film may deteriorate a resultant LCD device.

SUMMARY OF THE INVENTION

Accordingly, the present invention is directed to a plasma apparatus using a substrate supporting means that substantially obviates one or more of the problems due to limitations and disadvantages of the related art.

An object of the present invention is to provide a substrate supporting means having a wire and a plasma apparatus using the substrate supporting means.

Another object of the present invention is to provide a substrate supporting means and a plasma apparatus using the substrate supporting means where a uniformity in a fabrication process is improved.

Another object of the present invention is to provide a substrate supporting means and a plasma apparatus using the substrate supporting means where a heat is uniformly transmitted to a substrate and a plasma is uniformly formed during a fabrication process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a means for supporting a substrate includes: a susceptor; a supporting frame over the susceptor; and at least one wire connected to the supporting frame.

In another aspect, an apparatus includes: a process chamber for treating a substrate; a susceptor in the process chamber; a supporting frame over the susceptor; and at least one wire connected to the supporting frame.

In another aspect, an apparatus includes: a process chambers for treating a substrate; a susceptor in the process chamber; a plurality of wires over the susceptor, the plurality of wires being connected to one of a sidewall and a bottom surface of the process chamber; and a tension controlling unit connected to one end of each wire.

In another aspect, a method of transferring a substrate in an apparatus includes; a) moving a robot arm having the substrate thereon into a process chamber of the apparatus, the robot arm being disposed over a supporting frame, a plurality of wires connected to the supporting frame, and a susceptor under the supporting frame in the process chamber; b) moving down the robot arm such that the substrate is supported by the plurality of wires; c) moving the robot arm out of the process chamber; and d) moving up the susceptor such that the substrate is supported by the susceptor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Since the present invention relates to a plasma apparatus such as a plasma enhanced chemical vapor deposition (PECVD) apparatus and an etcher where process gases are excited to a plasma state in a chamber and contact a substrate, the plasma apparatus may be a fabrication apparatus for a liquid crystal display (LCD) device or a semiconductor device. In addition, the substrate may be a glass substrate for an LCD device or a wafer for a semiconductor device.

Figure 1:
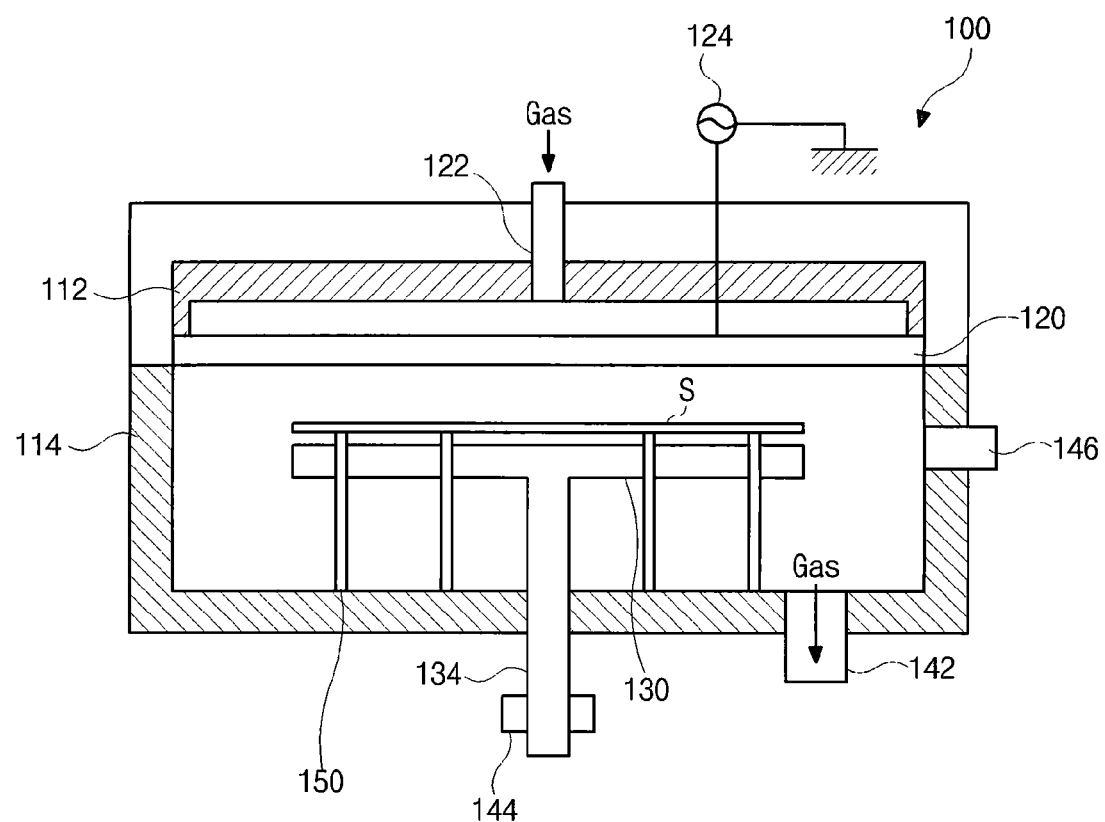
FIG. 1 is a schematic cross-sectional view showing a plasma apparatus for a liquid crystal display device according to the related art.
Figure 2A:
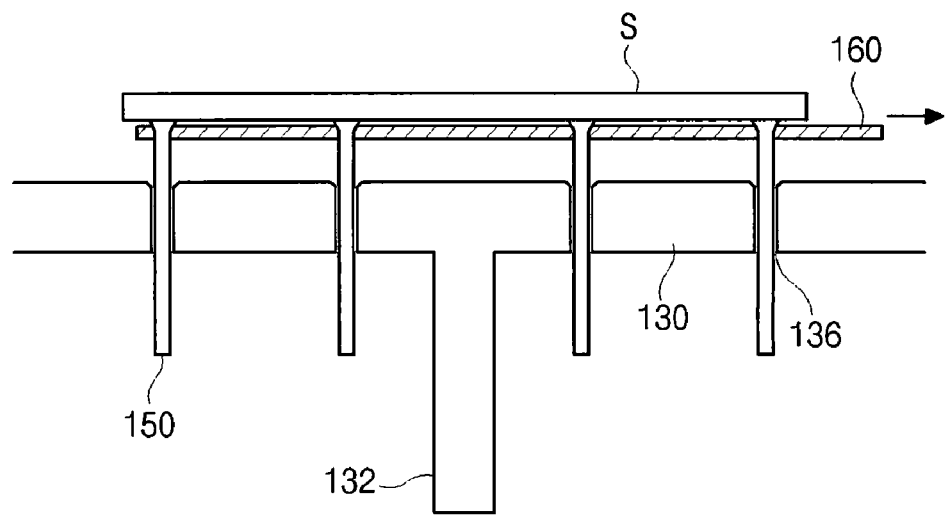
FIGS. 2A to 2C are schematic cross-sectional views showing a transfer process of a substrate in a plasma apparatus for a liquid crystal display device according to the related art.
Figure 2B:
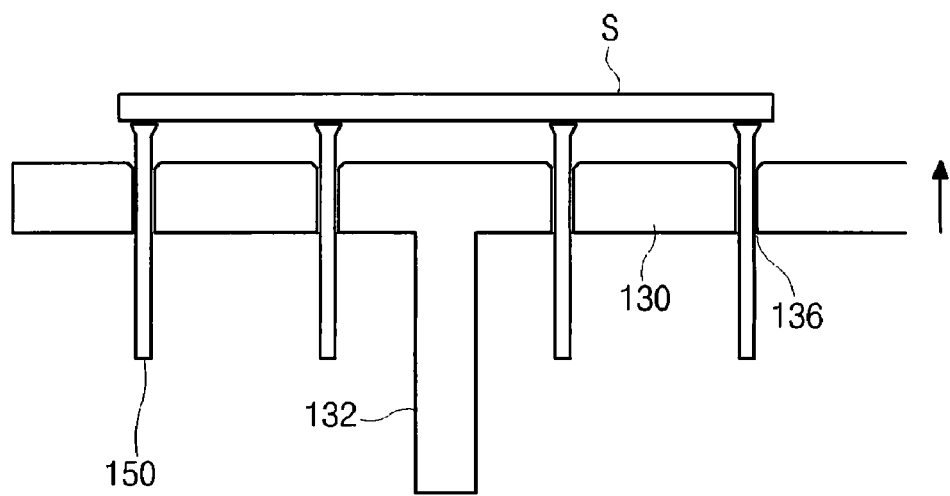
Figure 2C:
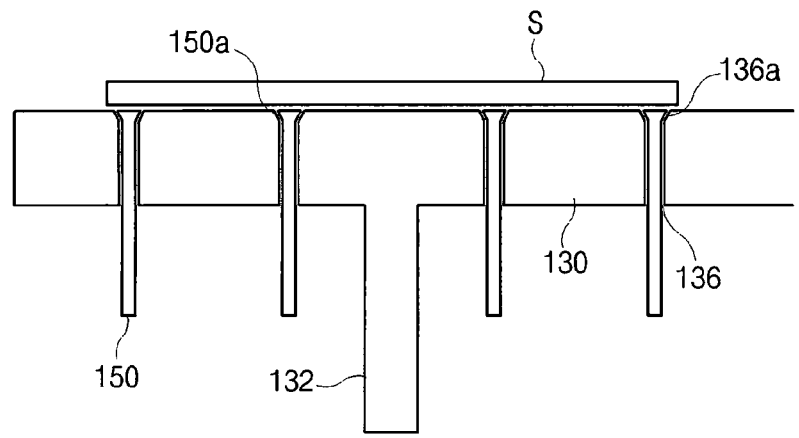
Figure 3:
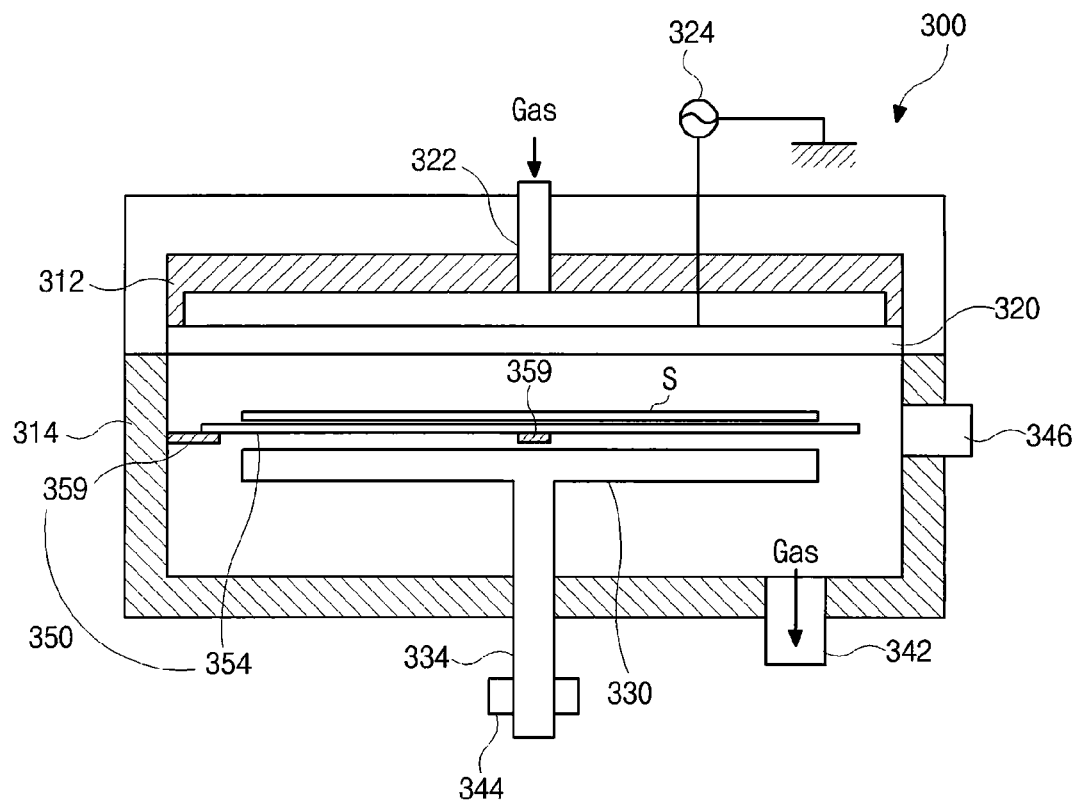
FIG. 3 is a schematic cross-sectional view of a plasma apparatus according to an exemplary embodiment of the present invention.

FIG. 3 is a schematic cross-sectional view of a plasma apparatus according to an exemplary embodiment of the present invention.

In FIG. 3, a plasma apparatus has a process chamber 300 including a lid 312 and a chamber body 314. A gas inlet pipe 322 is formed through a middle portion of the lid 312 and a backing plate (not shown) under the lid 312. A shower head 320 having a plurality of through holes (not shown) is formed under the backing plate. Accordingly, source gases are injected to the shower head 320 through the gas inlet pipe 322 and are dispersed into a space over a susceptor 330 in the process chamber 300 through the plurality of through holes. Since a gas dispersion unit including the backing plate and the shower head 320 is connected to a high frequency (e.g., a radio frequency) power supply unit 324, the source gases are excited to have a plasma state. For example, the shower head 320 of the gas dispersion unit may function as an upper electrode to obtain a plasma state of the source gases. In addition, the chamber body 314 has a slot valve 346 for transferring a substrate "S." In another exemplary embodiment, the source gases may be injected into the process chamber 300 through a sidewall thereof and a gas dispersion unit may be formed of an injector type over a boundary portion of the susceptor 330.

The susceptor 330 is disposed in the chamber body 314 and separated from the shower head 320. After a substrate "S" is transferred into the process chamber 300, the substrate "S" is placed on the susceptor 330. A heater (not shown) connected to an external power source (not shown) is formed in the susceptor 330 for heating the substrate "S" during a fabrication process. For example, the susceptor 330 may function as a lower electrode to obtain a plasma state of the source gases. A susceptor-supporter 334 perpendicularly extends from a rear central portion of the susceptor 330 and a susceptor driving unit 344 such as a motor is connected to the susceptor supporter 334 to move up and down the susceptor 330. In addition, a gas outlet pipe 342 is formed through a bottom portion of the chamber body 314. The gas outlet pipe 342 is connected to a vacuum pump (not shown) to evacuate residual gases and particles in the process chamber 300.

Specifically, a substrate supporting unit 350 including a wire 352 (of FIG. 4A) is disposed over the susceptor 330. The wire 352 transverses an inner space of the process chamber 300 and supports the substrate "S."

Figure 4A:
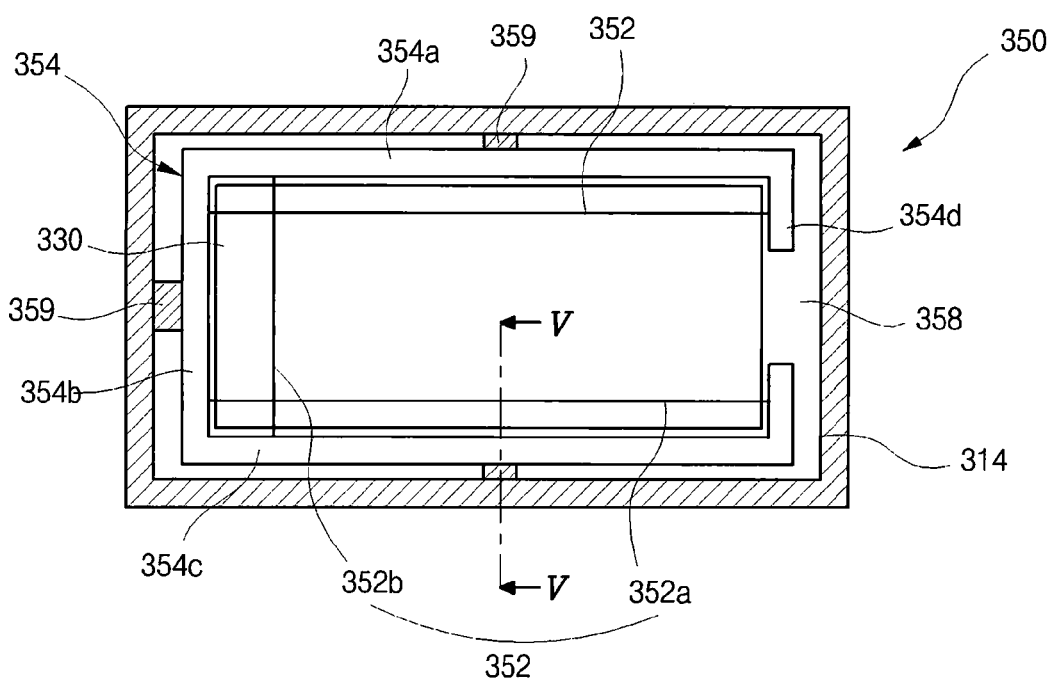
FIGS. 4A and 4B are schematic plane and perspective views, respectively, showing a substrate supporting unit in a plasma apparatus according to an exemplary embodiment of the present invention.
Figure 4B:
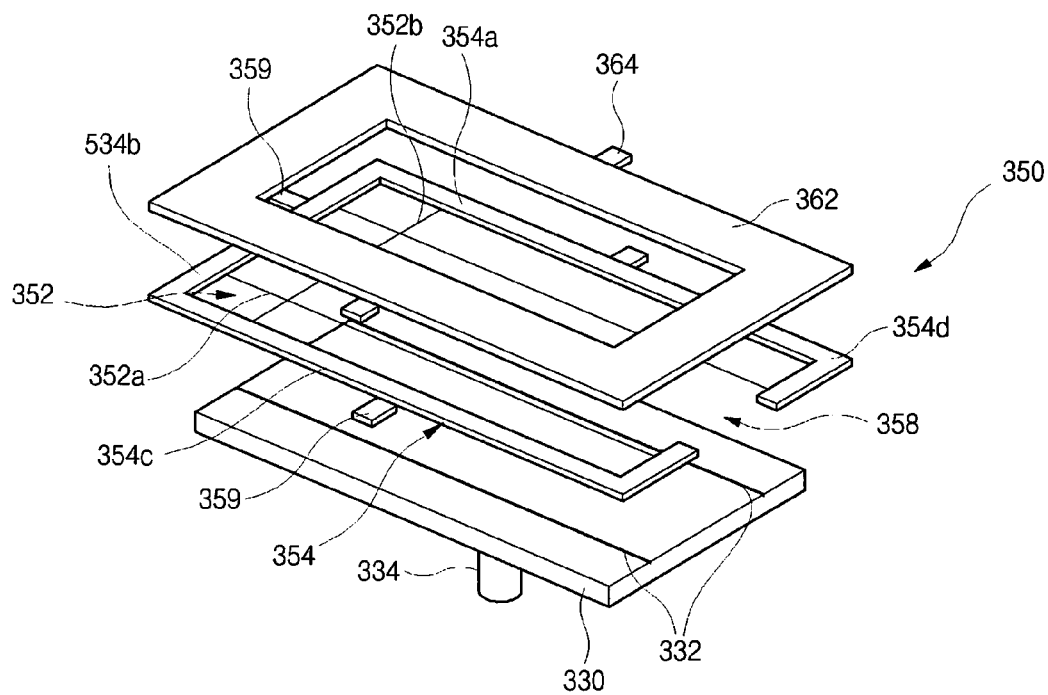

FIGS. 4A and 4B are schematic plane and perspective views, respectively, showing a substrate supporting unit in a plasma apparatus according to an exemplary embodiment of the present invention.

In FIGS. 4A and 4B, a substrate supporting unit 350 includes a plurality of wires 352, a supporting frame 354 and a supporting frame terminal 359. The plurality of wires 352 include a first wire 352a and a second wire 352b crossing the first wire 352a, and the supporting frame 354 has a rectangular shape including first, second, third and fourth sides 354a, 354b, 354c and 354d. The supporting frame 354 may have a different shape according to a substrate having a different shape in another embodiment. Both ends of each wire 352 are connected to the opposite sides of the supporting frame 354, respectively. The supporting frame terminal 359 is formed on a sidewall of the process chamber 300 (of FIG. 3) and the supporting frame 354 is placed on the supporting frame terminal 359.

The plurality of wires 352 substantially contact and support a substrate while the substrate is transferred from an exterior of the process chamber 300 (of FIG. 3) to the susceptor 330 and from the susceptor 330 to the exterior of the process chamber 300 (of FIG. 3). When a substrate has a rectangular shape including two long side and two short sides, for example, the plurality of wires 352 may include first wires 352a parallel to the long sides of the substrate and second wires 352b parallel to the short sides of the substrate. The first wires 352a may correspond to long edge portions of the substrate, and the second wire 352b may correspond to a short edge portion of the substrate opposite to a slot valve 346 (of FIG. 3) of the process chamber 300 (of FIG. 3). The first wires 352a may have one first wire corresponding to a central portion of the substrate. However, when one first wire is used, the substrate may be defected due to an inclination of the substrate during a transfer between the plurality of wires 352 and the susceptor 330. Accordingly, at least two symmetric first wires 352a may be used for the plurality of wires 352 along a direction parallel to the long sides of the substrate.

The plurality of wires 352 may have a predetermined tension for supporting the substrate by the supporting frame 354 having the first, second, third and fourth sides 354a, 354b, 354c and 354d. For example, the first wires 352a may be connected to the second and fourth sides 354b and 354d, and the second wires 352b may be connected to the first and third sides 354a and 354c. When the supporting frame 354 has a predetermined thickness, the plurality of wires 352 may be connected to one of top, middle and bottom portions of the supporting frame 354. In addition, one of the sides of the supporting frame 354 has an open portion 358 so that a robot arm 360 (of FIG. 6A) having a substrate "S" (of FIG. 3) thereon can move into and out of the supporting frame 354 over the susceptor 330. Accordingly, the open portion 358 may be formed at a central portion of the fourth side 354d adjacent to the slot valve 346 (of FIG. 3).

The supporting frame 354 may be directly connected to the process chamber 300 (of FIG. 3) by a fixing means such as a bolt and nut in another embodiment. In this embodiment, the supporting frame 354 is placed on the supporting frame terminal 359 formed on a sidewall of the process chamber 300 (of FIG. 3). For example, the supporting frame terminal 359 may be formed on three portions of the sidewall corresponding to the first, second and third sides 354a, 354b and 354c except a portion corresponding to the fourth side 354d and the slot valve 346 (of FIG. 3).

Figure 5:
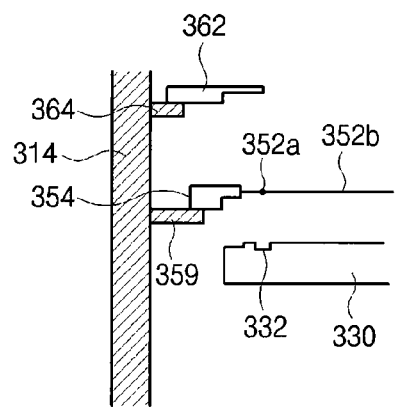
FIG. 5 is a schematic cross-sectional view taken along a line V-V of FIG. 4A.

FIG. 5 is a schematic cross-sectional view taken along a line V-V of FIG. 4A.

As shown in FIG. 5, the plurality of wires 352 are disposed over the susceptor 330 in the chamber body 314 and connected to the supporting frame 354 over boundary portions of the susceptor 330. The supporting frame 354 contacts and is placed on the fixing means 359 formed on the inner surface of the chamber body 314. Further, an edge frame 362 may be disposed over the supporting frame 354 and the plurality of wires 352. The edge frame 362 may cover the substrate "S" (of FIG. 3) and may be placed on an edge frame terminal 364 formed on the inner surface of the chamber body 314.

The supporting frame 354 may be formed not to overlap the susceptor 330 in another embodiment. In this embodiment, since the supporting frame 354 overlaps the susceptor 330, the supporting frame 354 contacts the boundary portion of the susceptor 330 when the susceptor 330 moves up. Accordingly, the supporting frame 354 is supported by the susceptor 330 while the susceptor 330 having the substrate "S" of (FIG. 3) thereon moves up and down with the supporting frame 354 and the plurality of wires 352. As a result, the fixing means 359 supports the supporting frame 354 before the susceptor 330 moves up and prevents a continuous decent of the supporting frame 354 when the susceptor moves down.

When the susceptor 330 moves up to support the substrate "S" (of FIG. 3), it is required that the substrate "S" (of FIG. 3) be horizontally placed on the susceptor 330. When the substrate "S" (of FIG. 3) is not horizontally placed on the susceptor 330, a heat from a heater in the susceptor 330 is not uniformly transmitted to the substrate "S" (of FIG. 3) and a thin film formed on the substrate "S" (of FIG. 3) has a poor uniformity in thickness. Accordingly, the susceptor 330 has a plurality of wire grooves 332 corresponding the plurality of wires 352 so that the substrate "S" (of FIG. 3) can be horizontally placed on the susceptor 330. The plurality of wires 352 can be completely wrapped in the plurality of wire grooves 332.

FIGS. 6A to 6F are schematic perspective views showing a method of transferring a substrate in a plasma apparatus according to an exemplary embodiment of the present invention and FIGS. 7A to 7F are schematic cross-sectional views showing a method of transferring a substrate in a plasma apparatus according to an exemplary embodiment of the present invention.

Figure 6A:
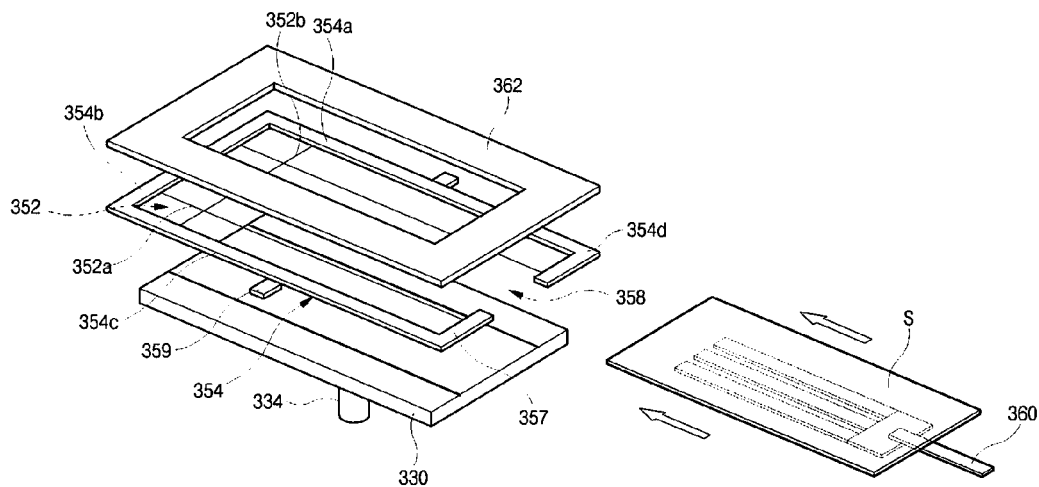
FIGS. 6A to 6F are schematic perspective views showing a method of transferring a substrate in a plasma apparatus according to an exemplary embodiment of the present invention.
Figure 7A:
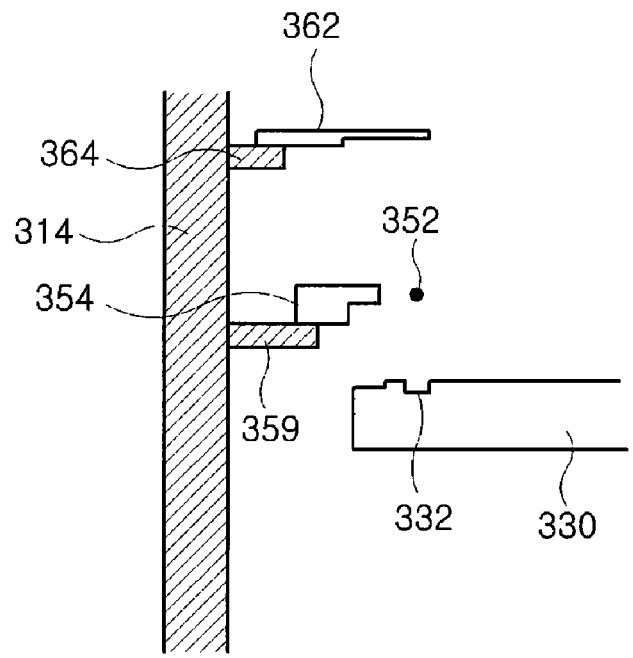
FIGS. 7A to 7F are schematic cross-sectional views showing a method of transferring a substrate in a plasma apparatus according to an exemplary embodiment of the present invention.

In FIGS. 6A and 7A, the substrate "S" on the robot arm 360 is transferred into the process chamber 300 (of FIG. 3) through the slot valve 346 (of FIG. 3). The edge frame 362, the supporting frame 354 and the susceptor 330 are disposed in the process chamber 300 (of FIG. 3). The edge frame 362 and the supporting frame 354 are connected to the sidewall of the chamber body 314 through the edge frame terminal 364 and the supporting frame terminal 359, respectively.

Figure 6B:
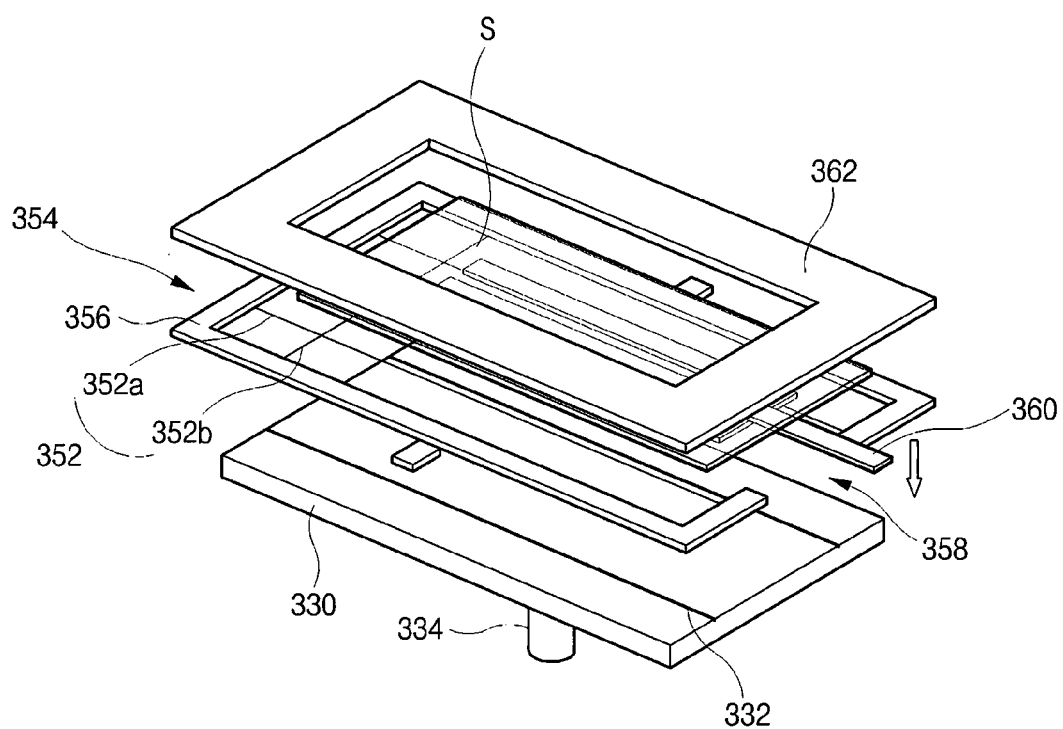
Figure 7B:
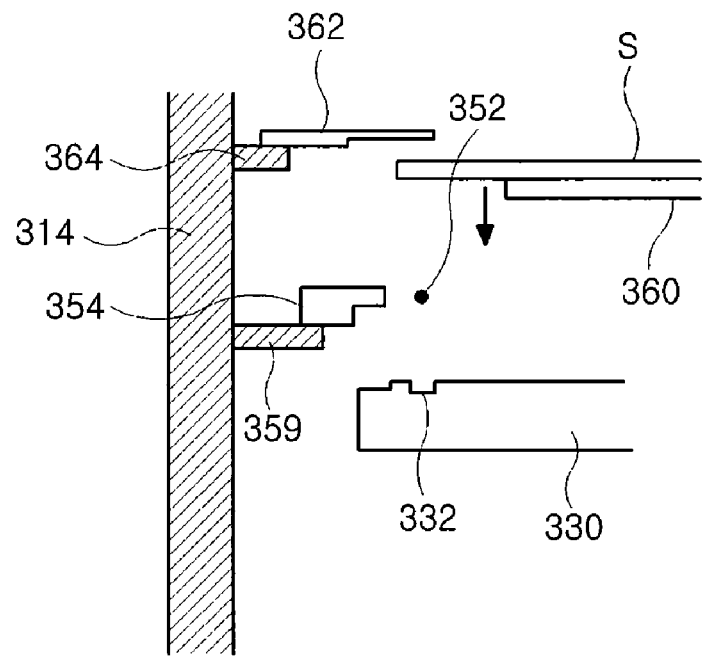

In FIGS. 6B and 7B, the robot arm 360 having the substrate "S" thereon moves and is arranged at a central portion of the process chamber 300 (of FIG. 3) corresponding to the susceptor 330. The robot arm 360 having the substrate "S" thereon is placed between the edge frame 362 and the supporting frame 354. Accordingly, the plurality of wires 352 and the supporting frame 354 are spaced apart from a bottom surface of the robot arm 360 and a top surface of the susceptor 330. Then, the robot arm 360 having the substrate "S" thereon moves down.

Figure 6C:
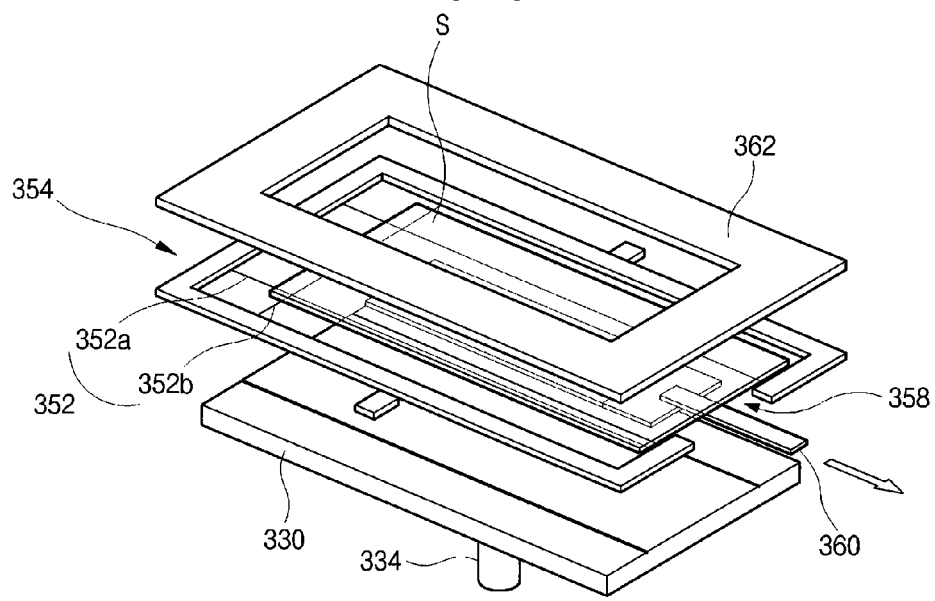
Figure 7C:
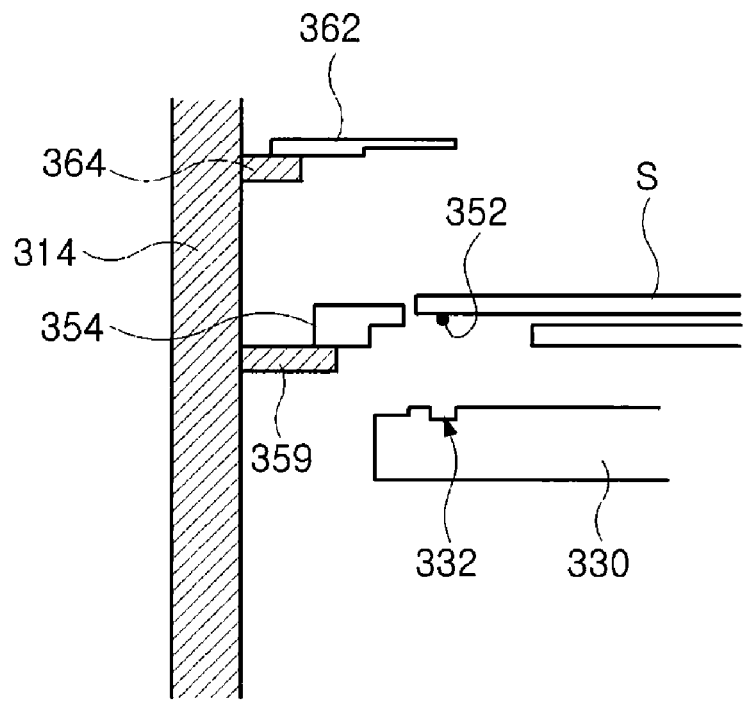

In FIGS. 6C and 7C, since the supporting frame 354 has the open portion 358, the robot arm 360 having the substrate "S" thereon can be arranged in the supporting frame 354 without contact of the robot arm 360 and the supporting frame 354. Since the plurality of the wires 352 is disposed outside the robot arm 360, the plurality of wires 352 contacts the backside of the substrate "S." Accordingly, the substrate "S" is supported by the plurality of wires 352 and the robot arm 360 is separated from the substrate "S." The robot arm 360 keeps moving down even after the plurality of wires 352 supports the substrate "S."

Figure 6D:
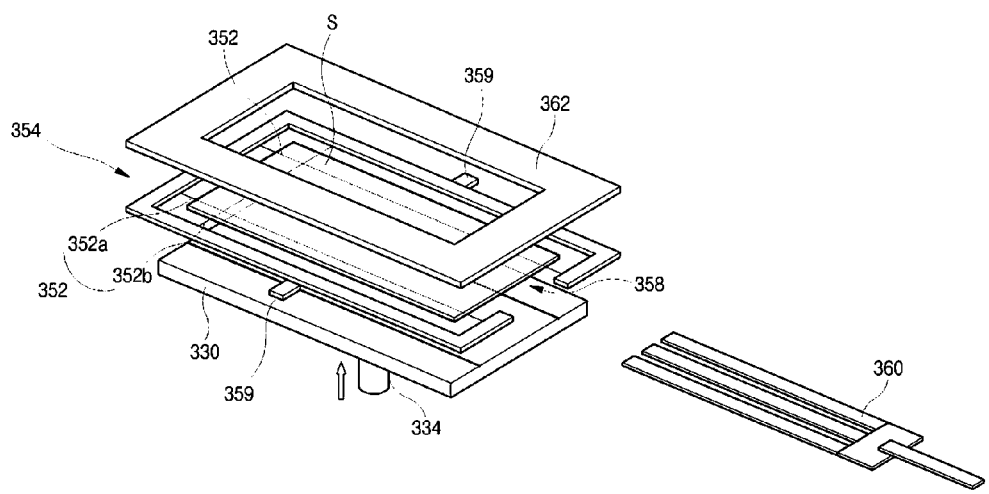
Figure 7D:
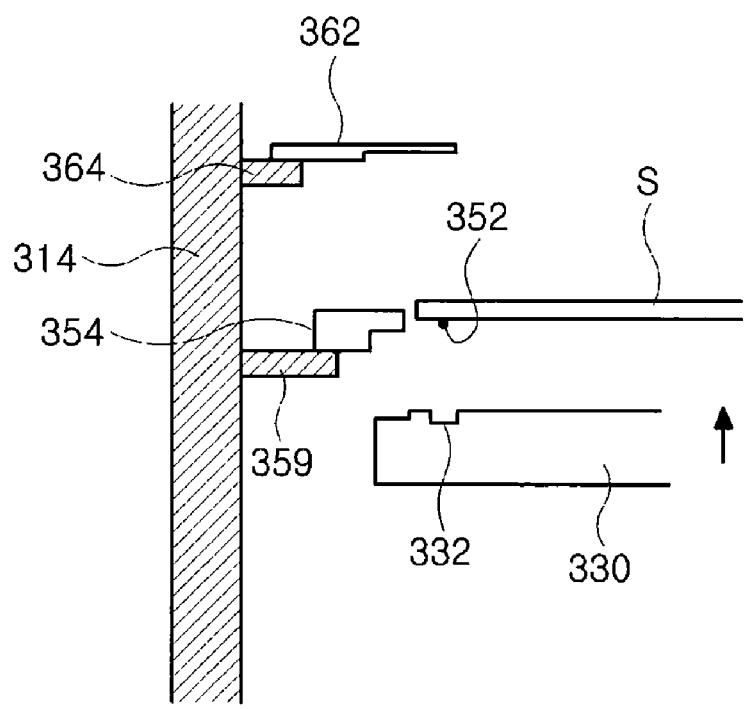

In FIGS. 6D and 7D, the robot arm 360 stops moving down before contacting the susceptor 330 and moves out of the process chamber 300 (of FIG. 3). As a result, the substrate "S" is fully supported by the plurality of wires 352 connected to the supporting frame 354. In addition, the supporting frame 354 is supported by the supporting frame terminal 359 fixed on the sidewall of the process chamber 300 (of FIG. 3). The substrate "S" and the plurality of wires 352 are separated from the susceptor 330. Then, the susceptor 330 moves up by the susceptor driving unit 344 (of FIG. 3).

Figure 6E:
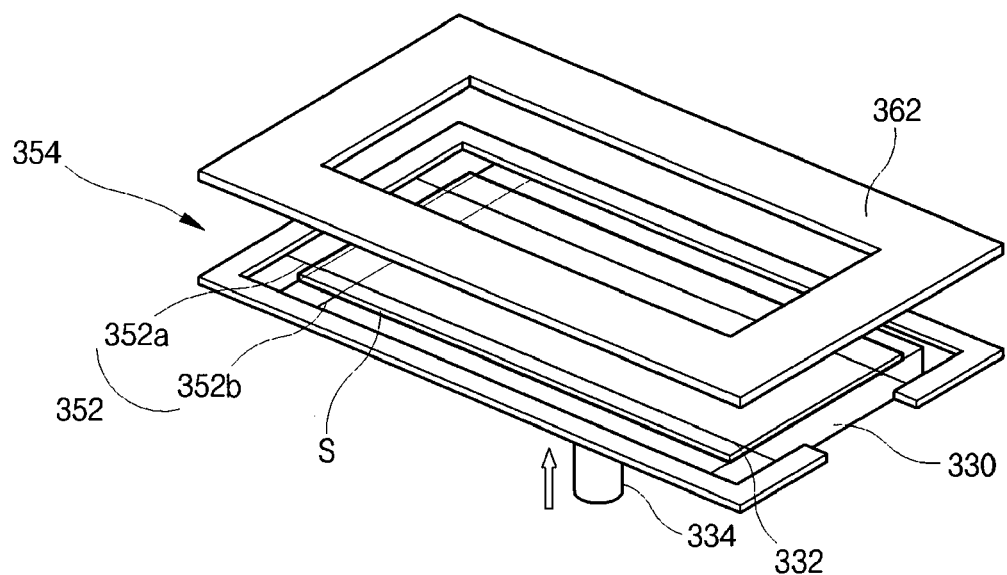
Figure 7E:
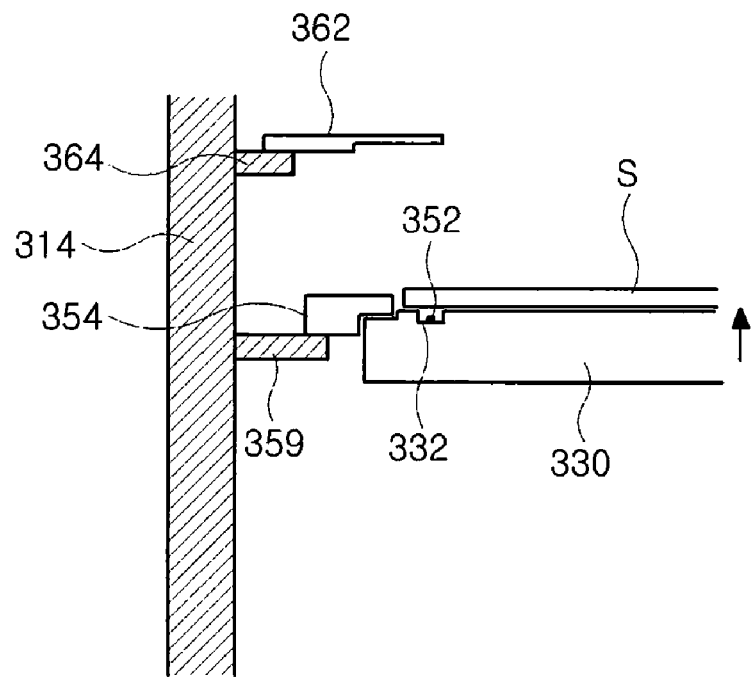

In FIGS. 6E and 7E, the plurality of wires 352 contact the top surface of the susceptor 330. Since the susceptor 330 has the plurality of wire grooves 332, the plurality of wires 352 are completely wrapped in the plurality of wire grooves 332. If the susceptor 330 does not have the plurality of wire grooves 332, the plurality of wires may constitute protrusions of the susceptor 330 and the substrate "S" may not be horizontally placed on the susceptor 330. Portions of the substrate "S" adjacent to the plurality of wires 352 do not contact the susceptor 330, while the other portions of the substrate "S" far from the plurality of wires 352 contact the susceptor 330. Accordingly, the heat from the heater (not shown) in the susceptor 330 is not completely transmitted to the substrate "S" and the incomplete transmission of the heat may cause a poor uniformity of the thin film in thickness. In this embodiment, since the plurality of wires 352 are completely wrapped in the plurality of wire grooves 332, the susceptor 330 does not have a protrusion on the top surface thereof and the substrate "S" is horizontally placed on the susceptor 330.

If the supporting frame 354 is formed not to contact the susceptor 330 even after the susceptor 330 moves up, the supporting frame 354 may be suspended by the plurality of wires 352 and it is hard to obtain a constant tension of the plurality of wires 352. Accordingly, an outer bottom surface of the supporting frame 354 may contact a top surface of the supporting frame terminal 359 and an inner bottom surface of the supporting frame 354 may contact a top surface of the susceptor 330 when the susceptor 330 moves up.

Figure 6F:
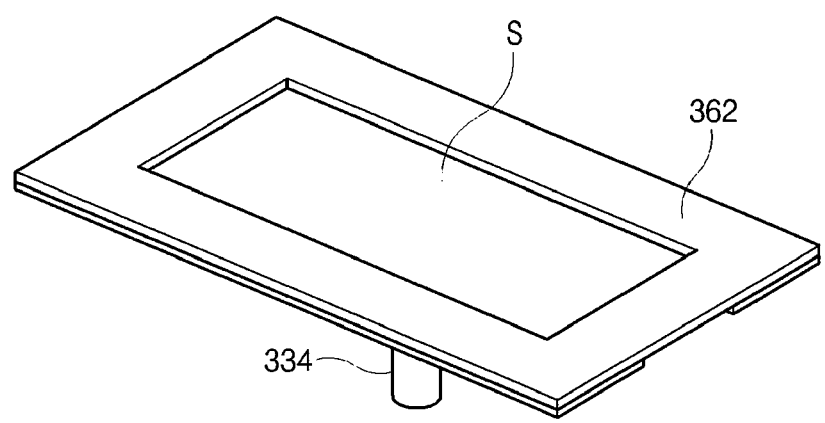
Figure 7F:
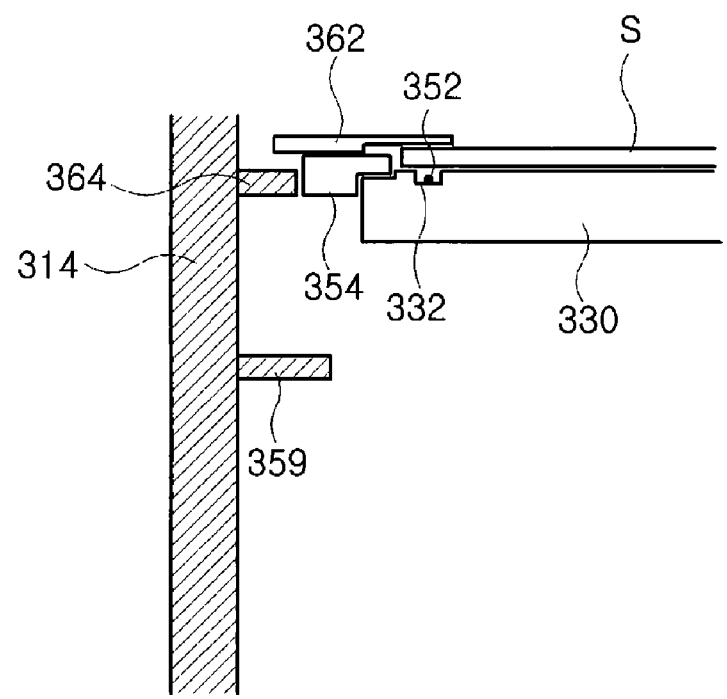

In FIGS. 6F and 7F, the susceptor 330 further moves up. Since the supporting frame 354 is not fixed to the supporting frame terminal 359, the supporting frame 354, the substrate "S" and the plurality of wires 352 move up with the susceptor 330. Accordingly, the supporting frame 354 is separated from the supporting frame terminal 359, and then the edge frame 362 contacts boundary portions of the substrate "S" and the susceptor 330 to prevent a leakage of the source gases. As a result, the supporting frame 354 is movable above the supporting frame terminal 359 and is protruded toward a central portion of the process chamber 300 (of FIG. 3) to contact the susceptor 330.

Next, the source gases are excited to a plasma state and are deposited on the substrate "S" to form a thin film. After forming the thin film, the substrate "S" having the thin film thereon is transferred out of the process chamber 300 (of FIG. 3) through a procedure reverse to the procedure shown in FIGS. 6A to 6F and 7A to 7F. After the thin film is formed on the substrate "S," the susceptor 330 having the substrate "S" and the supporting frame 354 thereon moves down and the supporting frame 354 is supported by the supporting frame terminal 359. Next, as the susceptor 330 further moves down, the supporting frame 354 and the plurality of wires 352 are separated from the susceptor 330. As a result, the substrate "S" is supported by the plurality of wires 352. Next, the robot arm 360 moves into the process chamber 300 (of FIG. 3) and is disposed between the substrate "S" and the susceptor 330. Then, the robot arm 360 moves up to contact the substrate "S" and the plurality of wires 352 are separated from the substrate "S." As a result, the substrate "S" is supported by the robot arm 360. Next, the robot arm 360 having the substrate "S" thereon moves out of the process chamber 300 (of FIG. 3).

In a plasma apparatus according to this embodiment of the present invention, a substrate is transferred using a plurality of wires 352 instead of a plurality of lift pins. The plurality of wires 352 are interposed in the plurality of wire grooves 332 of during a fabrication process of a thin film. The substrate "S" is heated by a heater in the susceptor 330 during the fabrication process of a thin film. After the fabrication process, a cleaning gas including fluorine (F) or chlorine (Cl) is injected into the process chamber 300 (of FIG. 3) to evacuate residual gases. Accordingly, the plurality of wires 352 may be formed of a metallic material having a high tension, a high corrosive resistance and a high thermal resistance. For example, one of stainless steel including chromium (Cr) or nickel (Ni), inconel alloy, monel alloy, hastelloy alloy, steel for piano and high carbon steel for piano may be used for the plurality of wires 352.

Figure 8:
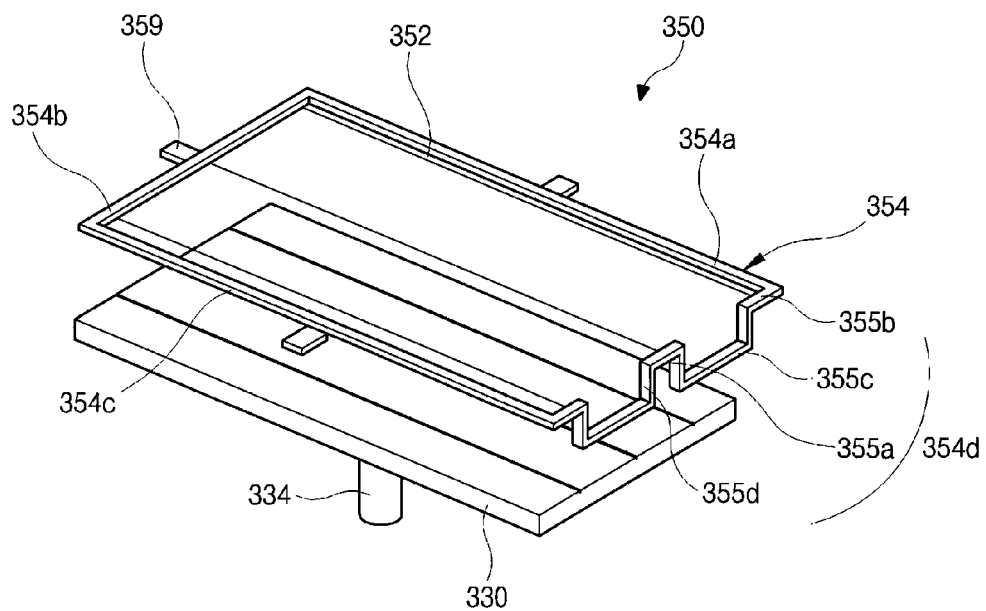
FIG. 8 is a schematic perspective view showing a substrate supporting unit in a plasma apparatus according to another exemplary embodiment of the present invention.

FIG. 8 is a schematic perspective view showing a substrate supporting unit in a plasma apparatus according to another exemplary embodiment of the present invention. In FIG. 8, elements the same as those of FIG. 4B have the same reference numbers as those of FIG. 4B, and illustrations for the elements are omitted.

In FIG. 8, a substrate supporting unit 350 includes a plurality of wires 352, a supporting frame 354 and a supporting frame terminal 359. The supporting frame 354 has a first, second, third and fourth sides 354a, 354b, 354c and 354d. The fourth side 354d corresponding to a slot valve (not shown) has an indented shape of a central upper horizontal portion 355a, a boundary upper horizontal portion 355b, a lower horizontal portion 355c and a vertical portion 355d connecting the upper horizontal portions 355a and 355b and the lower horizontal portion 355c. The plurality of wires 352 are connected to the upper horizontal portions 355a and 355b.

Figure 9A:
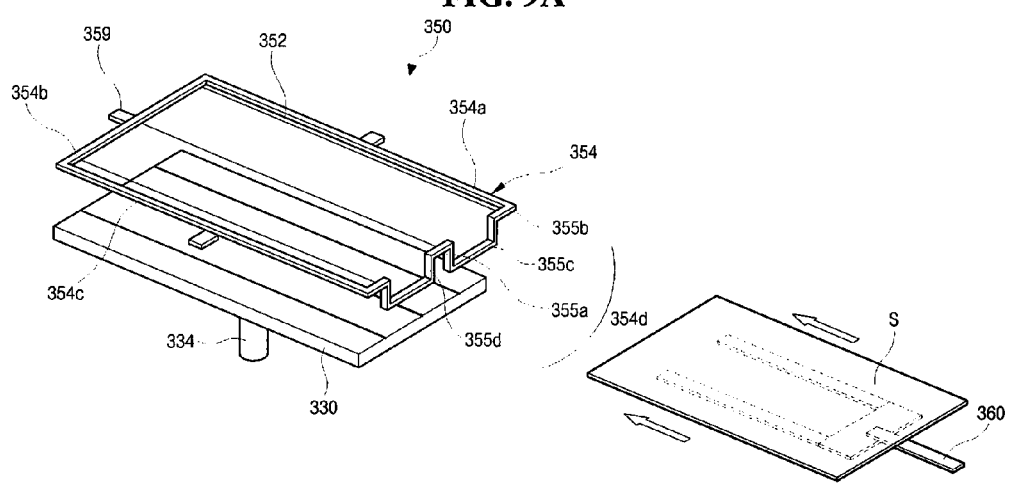
FIGS. 9A and 9B are schematic perspective views showing a method of transferring a substrate in a plasma apparatus according to another exemplary embodiment of the present invention.
Figure 9B:
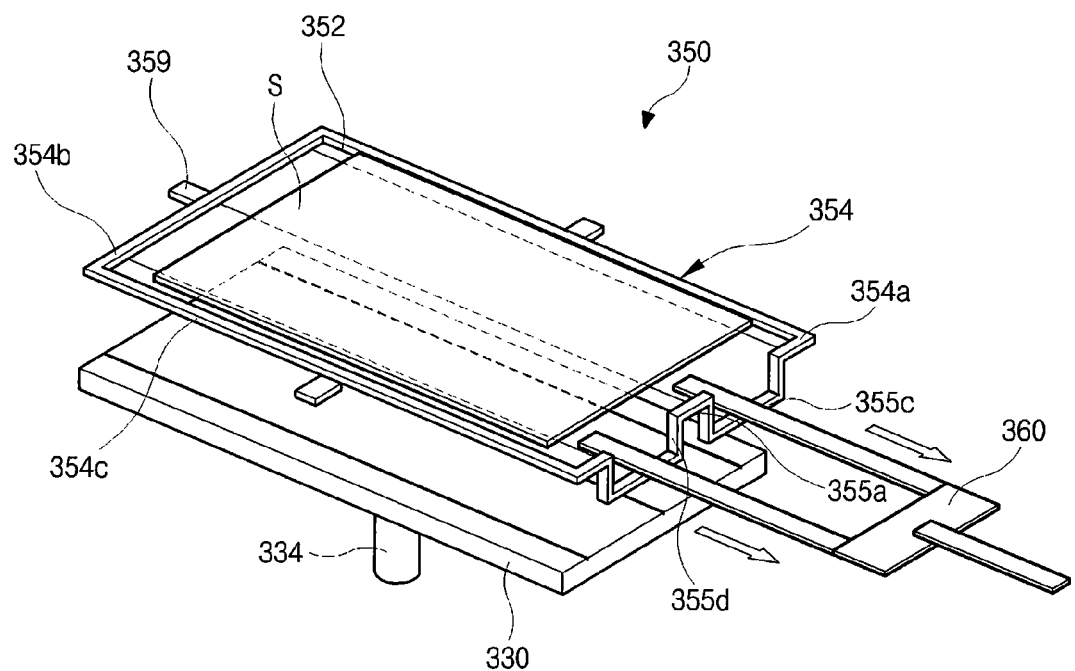

FIGS. 9A and 9B are schematic perspective views showing a method of transferring a substrate in a plasma apparatus according to another exemplary embodiment of the present invention.

In FIG. 9A, a substrate "S" on a robot arm 360 is transferred into a process chamber (not shown) through the slot valve (not shown). A substrate supporting unit 350 including a plurality of wires 352, a supporting frame 354 and a supporting frame terminal 359 and a susceptor 330 are disposed in the process chamber. The robot arm 360 having the substrate "S" thereon moves into the process chamber and is disposed over the substrate supporting unit 350. Then, the robot arm 360 moves down and the substrate "S" contacts the plurality of wires 352a. Accordingly, the substrate "S" is supported by the plurality of wires 352a. Since a fourth side 354d of the supporting frame 354 has an indented portion consisting of a central upper horizontal portion 355a, a boundary upper horizontal portion 355b, a lower horizontal portion 355c and a vertical portion 355d connecting the upper horizontal portions 355a and 355b and the lower horizontal portion 355c, the robot arm 360 can move down without contacting the supporting frame 354.

In FIG. 9B, the robot arm 360 moves out of the process chamber without contacting the supporting frame 354 due to the intended portion of the fourth side 354d. The intended portion of the supporting frame 354 may have various shapes in another embodiments.

Figure 10:
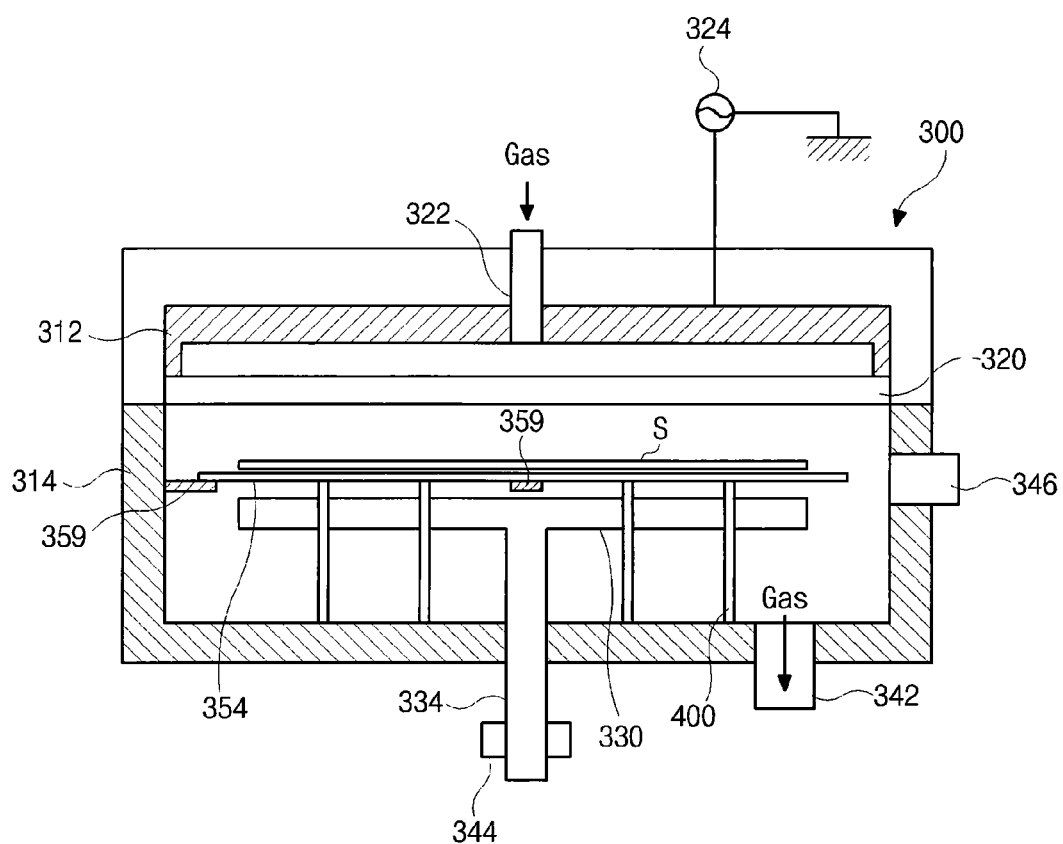
FIG. 10 is a schematic cross-sectional view of a plasma apparatus according to another exemplary embodiment of the present invention.
Figure 11:
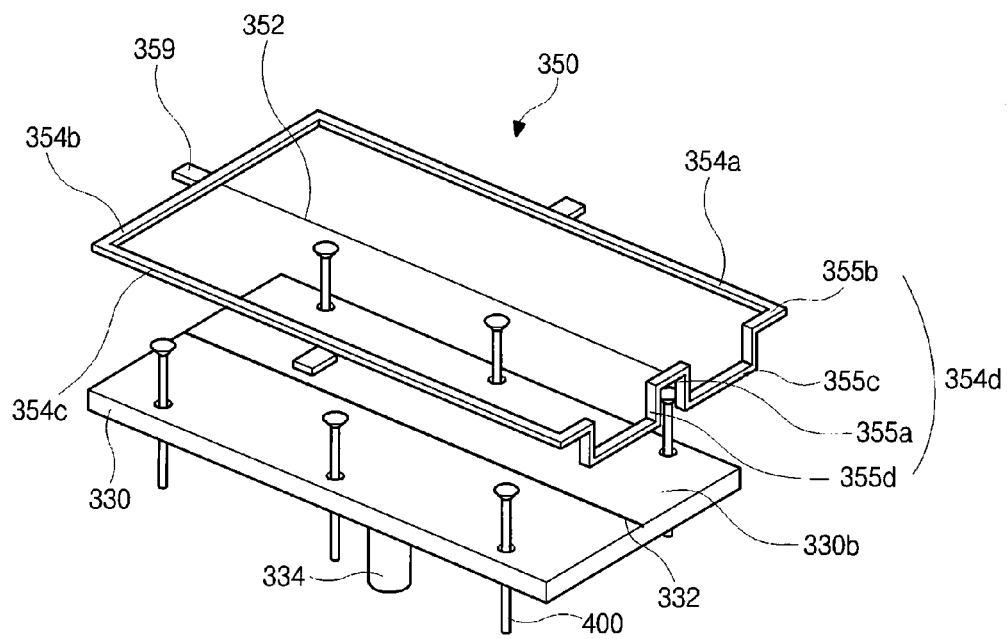
FIG. 11 is a schematic perspective view showing a substrate supporting unit in a plasma apparatus according to another exemplary embodiment of the present invention.

FIG. 10 is a schematic cross-sectional view of a plasma apparatus according to another exemplary embodiment of the present invention and FIG. 11 is a schematic perspective view showing a substrate supporting unit in a plasma apparatus according to another exemplary embodiment of the present invention.

In FIGS. 10 and 11, a plasma apparatus has a process chamber 300 and a substrate "S" is inserted into the process chamber 300 through a slot valve 346. The inserted substrate "S" is supported by a plurality of wires 352 and a plurality of lift pins 400 of a substrate supporting unit 350. The plurality of wires 352 and the plurality of lift pins 400 correspond to a central portion and a boundary portion of the substrate "S," respectively. In addition, the plurality of wires 352 are disposed along a direction parallel to a long side of the substrate "S" and the plurality of lift pins 400 are spaced apart from each other. The plurality of wires 352 are connected to a supporting frame 354 having first, second, third and fourth sides 354a, 354b, 354c and 354d, and the fourth side 354d has an indented portion consisting of a central upper horizontal portion 355a, a boundary upper horizontal portion 355b, a lower horizontal portion 355c and a vertical portion 355d connecting the upper horizontal portions 355a and 355b and the lower horizontal portion 355c, the robot arm (not shown) can move down without contacting the supporting frame 354. The plurality of lift pins 400 are disposed through a boundary portion of a susceptor 330.

FIGS. 12A to 12D are schematic cross-sectional views showing a method of transferring a substrate in a plasma apparatus according to another exemplary embodiment of the present invention.

Figure 12A:
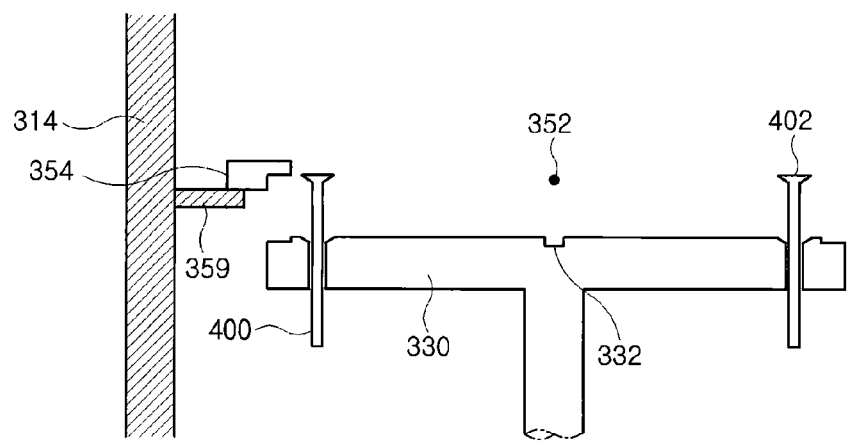
FIGS. 12A to 12D are schematic cross-sectional views showing a method of transferring a substrate in a plasma apparatus according to another exemplary embodiment of the present invention.

In FIG. 12A, the supporting frame 354 is disposed over the susceptor 330 and the plurality of lift pins 400 are protruded above a top surface of the susceptor 330 before the substrate "S" is inserted into the process chamber 300 (of FIG. 10). The plurality of wires 352 are formed in the supporting frame 354 and the supporting frame 354 is placed on a supporting frame terminal 359 formed on a chamber body 314. The plurality of wires 352 has substantially the same height as the plurality of lift pins 400.

Figure 12B:
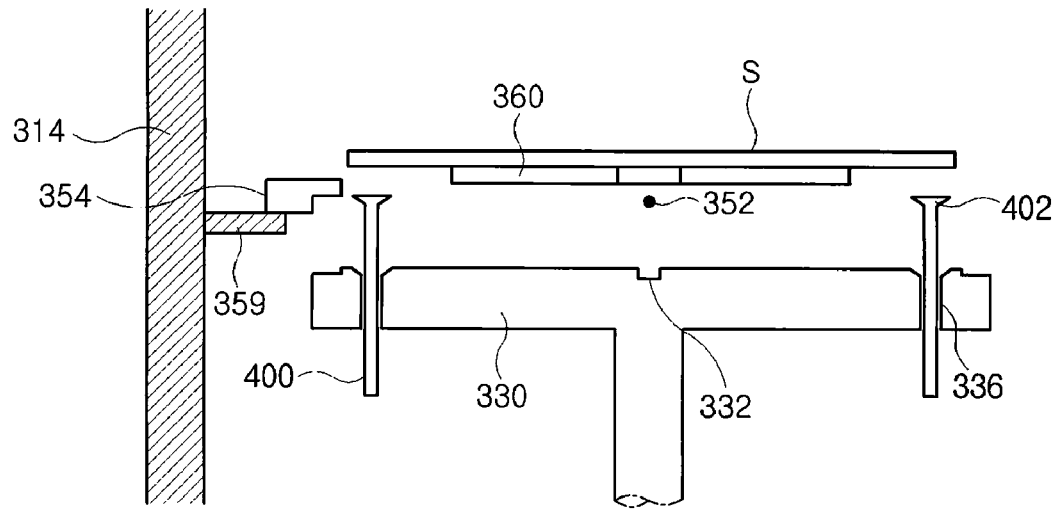

In FIG. 12B, the robot arm 360 having the substrate "S" thereon moves into the process chamber 300 (of FIG. 10) and is disposed over the susceptor 330. The plurality of wires 352 and the plurality of lift pins 400 are spaced apart from the substrate "S."

Figure 12C:
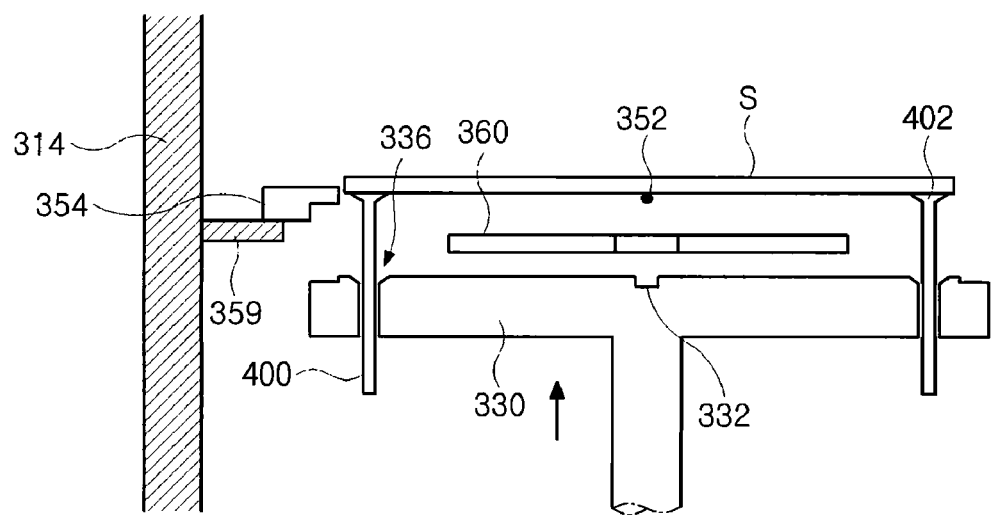

In FIG. 12C, the robot arm 360 having the substrate "S" thereon moves down and the substrate "S" is disposed in the supporting frame 350. Accordingly, the substrate contacts the plurality of wires 352 and the plurality of lift pins 400. Since the supporting frame 354 has an open portion 358 (of FIG. 11), the robot arm 360 can further move under the supporting frame 354. As a result, the robot arm 360 is separated from the substrate "S" and the substrate "S" is supported by the plurality of wires 352 and the plurality of lift pins 400. The plurality of wires 352 corresponds to a central portion of the substrate "S" and the plurality of lift pins 400 corresponds to a boundary portion of the substrate "S." Then, the robot arm 360 moves out of the process chamber 300 (of FIG. 10) through the slot valve 346 (of FIG. 10).

Figure 12D:
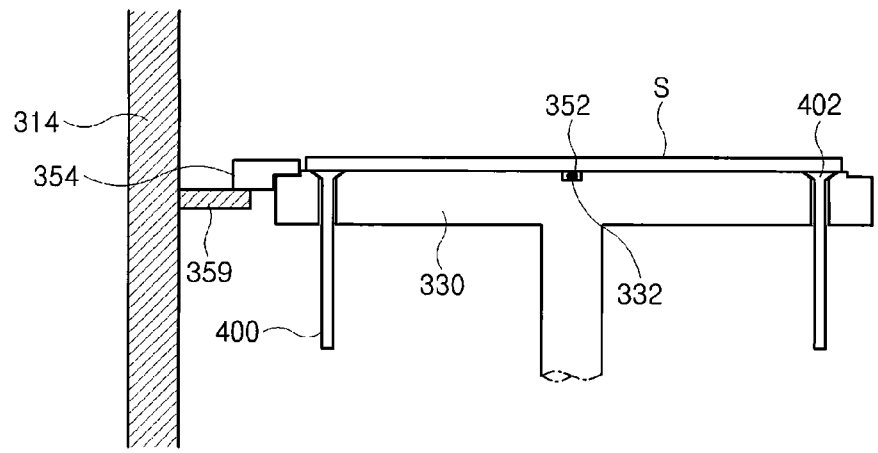

In FIG. 12D, the susceptor 330 having the substrate "S" thereon moves up by a susceptor driving unit (not shown) and the plurality of wires 352 are inserted into a plurality of wire grooves 332 of the susceptor 330. At the same time, the plurality of lift pins 400 relatively move down through a plurality of lift pin holes 336 in the susceptor 330. As a result, the substrate "S" contacts the susceptor 330 and is supported by the susceptor 330. A top portion 402 of each lift pin 400 may have a diameter greater than the other portion of each lift pin 400 to prevent complete separation of each lift pin 400 from the susceptor 330. Similarly, each lift pin hole 336 may have a shape corresponding to each lift pin 400.

Next, the susceptor 330 having the substrate "S" thereon further moves up and a thin film is formed on the substrate "S." After the thin film is formed on the substrate "S," the substrate "S" may be transferred out of the process chamber 300 (of FIG. 10) by inversely performing the procedure of FIGS. 12A to 12D.

Figure 13:
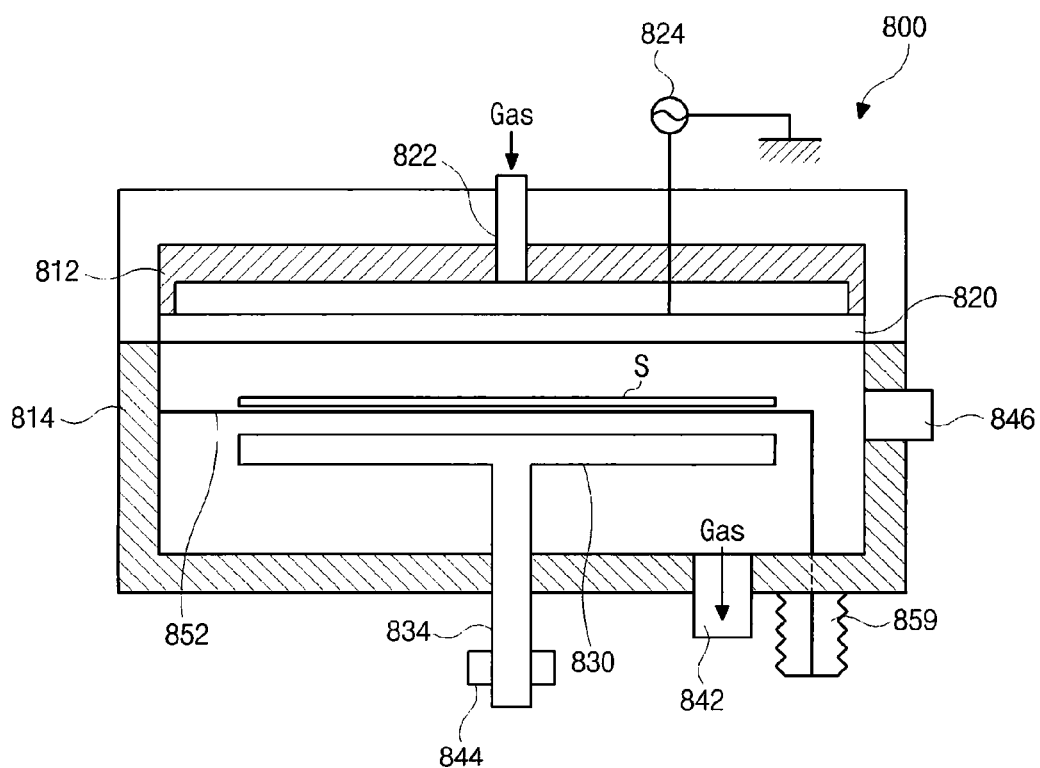
FIG. 13 is a schematic cross-sectional view of a plasma apparatus according to another exemplary embodiment of the present invention.
Figure 14A:
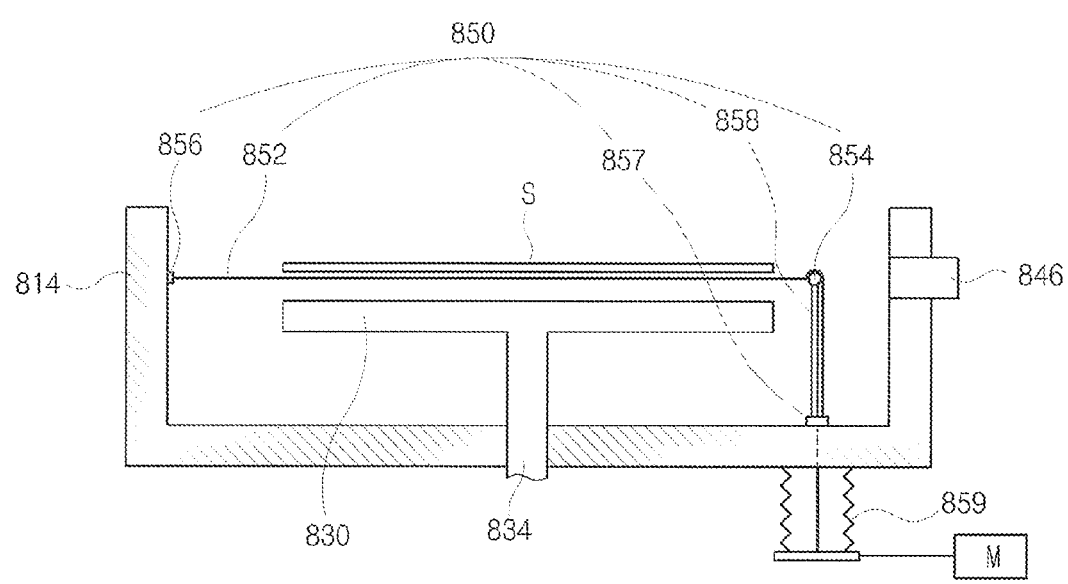
FIGS. 14A and 14B are schematic plane and perspective views, respectively, showing a substrate supporting unit in a plasma apparatus according to another exemplary embodiment of the present invention.
Figure 14B:
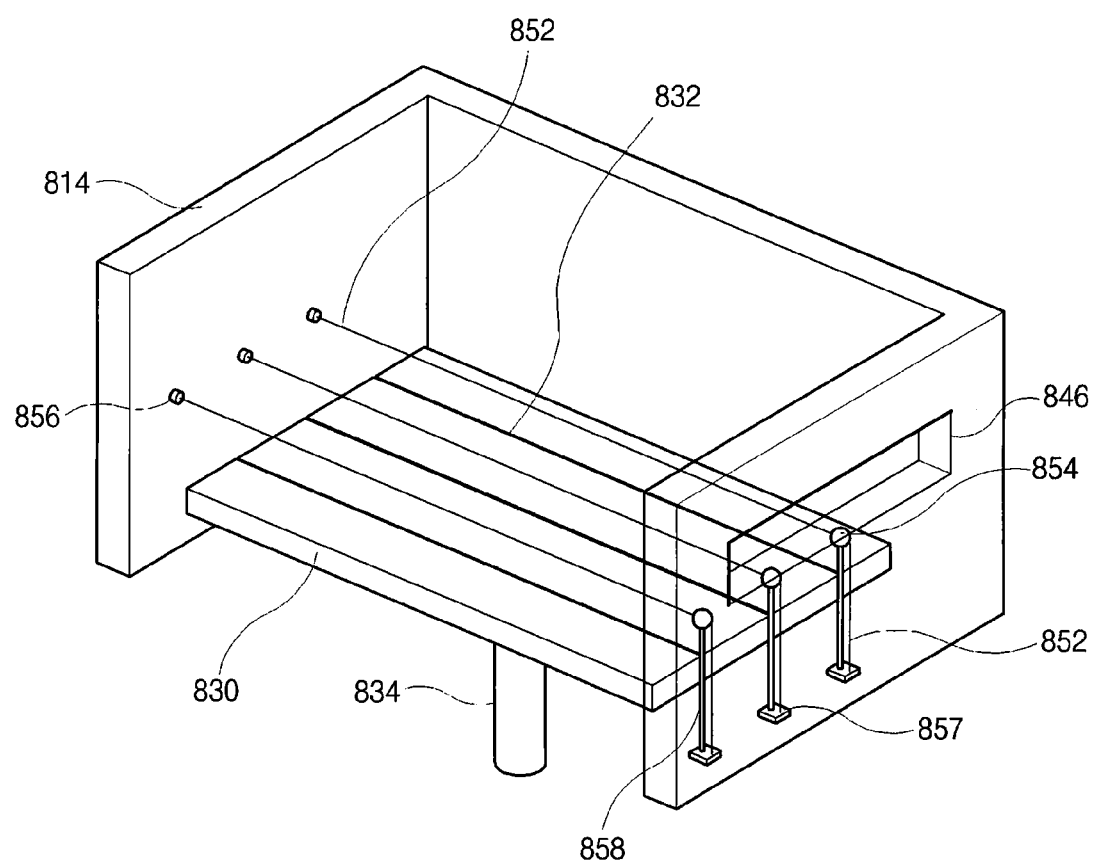

FIG. 13 is a schematic cross-sectional view of a plasma apparatus according to another exemplary embodiment of the present invention, and FIGS. 14A and 14B are schematic plane and perspective views, respectively, showing a substrate supporting unit in a plasma apparatus according to another exemplary embodiment of the present invention. In FIGS. 13, 14A and 14B, elements the same as those of FIGS. 3, 4A and 4B have the same reference numbers as those of FIGS. 3, 4A and 4B, and illustrations for the elements are omitted.

In FIG. 13, a process chamber 800 includes a lid 812 and a chamber body 814 under the lid 812. A gas inlet pipe 822 is formed through the lid 812, and a gas dispersion unit including a backing plate and a shower head 820 is disposed under the lid 812. The gas dispersion unit is connected to a high frequency power (e.g., a radio frequency) supply unit 824. A susceptor 830, a susceptor supporter 834 and a susceptor driving unit 844 are disposed in the chamber body 814, and a slot valve 846 and a gas outlet pipe 846 are formed in the chamber body 814. Specifically, a substrate supporting unit 850 (of FIG. 14A) including a plurality of wires 852 is disposed between the substrate "S" and the susceptor 830.

In FIGS. 14A and 14B, the substrate supporting unit 850 includes the plurality of wires 852, a plurality of direction changing means 854 and a plurality of wire terminals 856 and 857. Both ends of each wire 852 are fixed to a sidewall of the chamber body 814 and a bottom surface of the chamber body 814, respectively, through first and second wire terminals 856 and 857. Each wire 852 is horizontally disposed over the susceptor 830 and vertically extends outside the susceptor 830 by the direction changing means 854. The direction changing means 854 may be supported by a direction changing means supporter 858, and each wire 852 and the direction changing means supporter 858 may be fixed to the bottom surface of the chamber body 814 by the second wire terminal 857. In addition, a tension controlling unit 859 is connected to one end of each wire 852 to keep an optimum tension for supporting the substrate "S." The tension controlling unit 859 may have a bellows type. In addition, the tension controlling unit 859 and the susceptor driving unit 844 may be operated independently or simultaneously. For example, when the susceptor 830 moves up and down, the tension of each wire 852 is adjusted by contracting and expanding the tension controlling unit 859 of a bellows type.

The plurality of wires 852 may be disposed along a direction parallel to long sides of the substrate "S" and may be symmetrically disposed at a boundary portion of the susceptor 830 with respect to a central line of the susceptor 830. In addition, the direction changing means 854 may alter a horizontal direction of each wire 852 to a vertical direction, or vice versa. For example, a pulley may be used as the direction changing means 854. Further, the susceptor 830 may have a plurality of wire grooves 832 corresponding to the plurality of wires 852. Accordingly, the plurality of wires 852 can be completely inserted into the plurality of wire grooves 832, thereby the substrate "S" horizontally contacting the susceptor 830. Moreover, since the substrate supporting unit 850 does not include a supporting frame, the robot arm 860 having the substrate "S" thereon freely moves into and out of the process chamber 800 without any limitation regarding a supporting frame.

As a result, a first end of the wire 852 is connected to the sidewall of the chamber body 814 opposite to the slot valve 846 through the first wire terminal 856 and a second end of the wire is connected to the bottom surface of the chamber body 814 through the second wire terminal 857. The wire 852 horizontally extends over the susceptor 830 and vertically extends by the direction changing means 854 at an outer upper portion of the susceptor 830 adjacent to the slot valve 846. The tension controlling unit 859 is connected to the second end of the wire 852 to adjust tension of the wire 852.

Figure 15A:
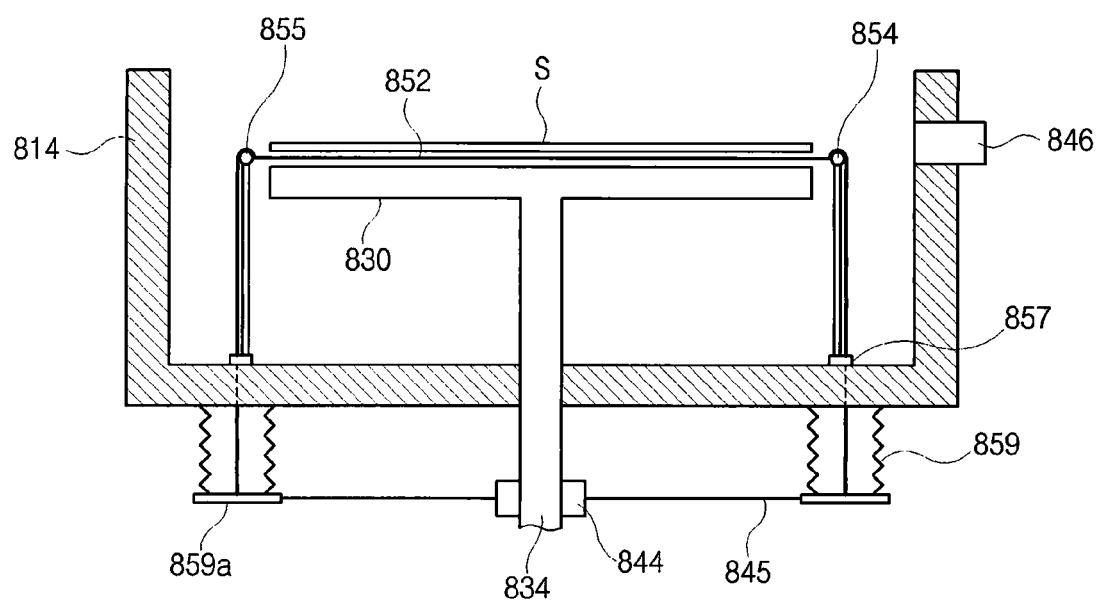
FIGS. 15A and 15B are schematic plane and perspective views, respectively, showing a substrate supporting unit in a plasma apparatus according to another exemplary embodiment of the present invention.
Figure 15B:
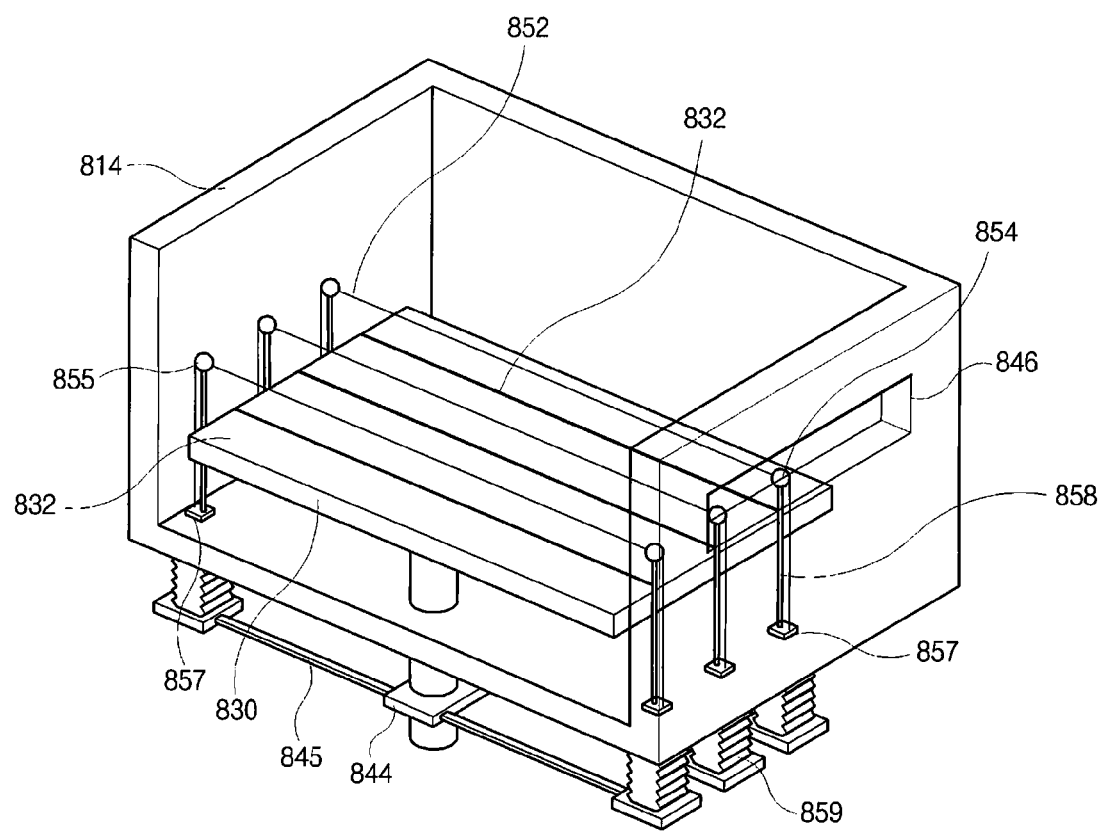

FIGS. 15A and 15B are schematic plane and perspective views, respectively, showing a substrate supporting unit in a plasma apparatus according to another exemplary embodiment of the present invention. In FIGS. 14A and 14B, elements the same as those of FIGS. 3, 4A and 4B have the same reference numbers as those of FIGS. 3, 4A and 4B, and illustrations for the elements are omitted.

In FIGS. 15A and 15B, a substrate supporting unit 850 includes a plurality of wires 852, a plurality of first direction changing means 854, a plurality of second direction changing means 856 and a plurality of wire terminals 857. Both ends of each wire 852 are connected a bottom surface of the chamber body 814 through the wire terminals 857. The wire 852 vertically extends from the bottom surface of the chamber body 814. The direction of the wire 852 is changed by the first direction changing means 854 and the wire 852 horizontally extends over a susceptor 830. The direction of the wire 852 is changed again by the second direction changing means 855 and the wire 852 vertically extends to the bottom surface of the chamber body 814. As a result, the first and second direction changing means 854 and 855 correspond to one wire 852. The wire 852 has a U-shape as a whole by the first and second direction changing means 854 and 855, and two ends of the wire 852 are connected to two opposite portions of the bottom surface of the chamber body 814.

The first and second direction changing means 854 and 855 may be supported by a direction changing means supporter 858, and the wire 852 and the direction changing means supporter 858 may be connected to the bottom surface of the chamber body 814 through the wire terminal 857. In addition, a tension controlling unit 859 is connected to two ends of the wire 852 to keep an optimum tension for supporting the substrate "S." For example, the tension controlling unit 859 may have a bellows type. The tension controlling unit 859 and the susceptor driving unit 844 may be operated independently or simultaneously. For example, a connection bar 859a may connect the susceptor driving unit 844 and the tension controlling unit 859 such that the susceptor driving unit 844 and the tension controlling unit 859 are simultaneously operated. When the susceptor 830 moves up and down, the tension of each wire 852 is adjusted by contracting and expanding the tension controlling unit 859 of a bellows type. Further, since the susceptor 830 has a plurality of wire grooves 832 corresponding to the plurality of wires 852, the plurality of wires 852 are completely inserted into the plurality of wire grooves 832 when the susceptor 830 moves up.

Figure 16A:
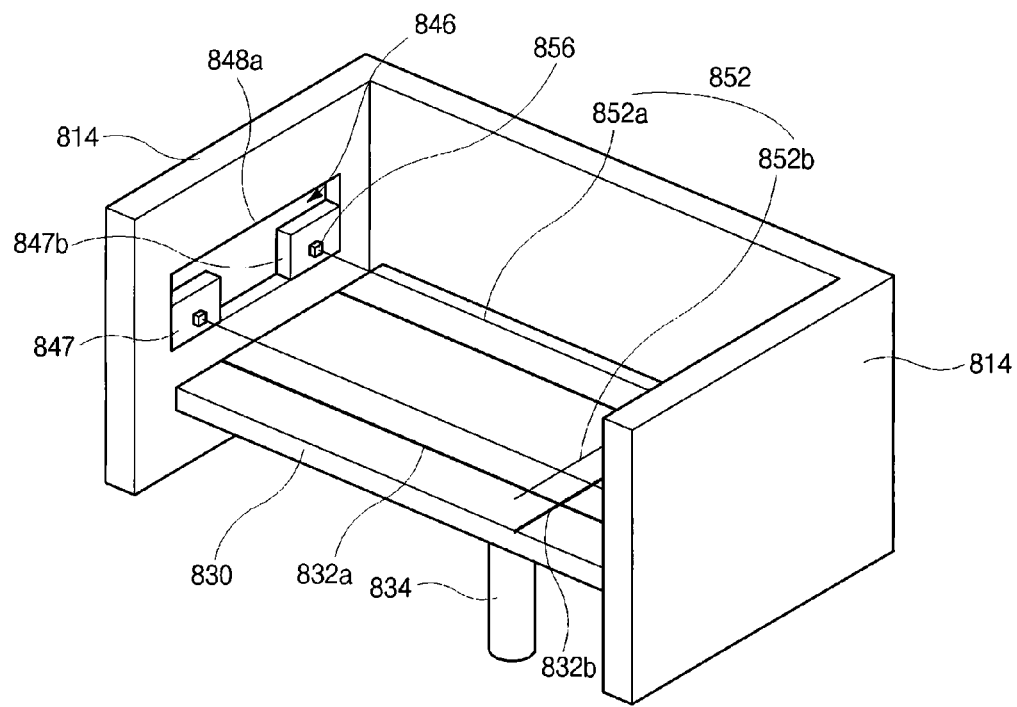
FIGS. 16A and 16B are schematic perspective and plane views showing a substrate supporting unit in a plasma apparatus according to another exemplary embodiment of the present invention.
Figure 16B:
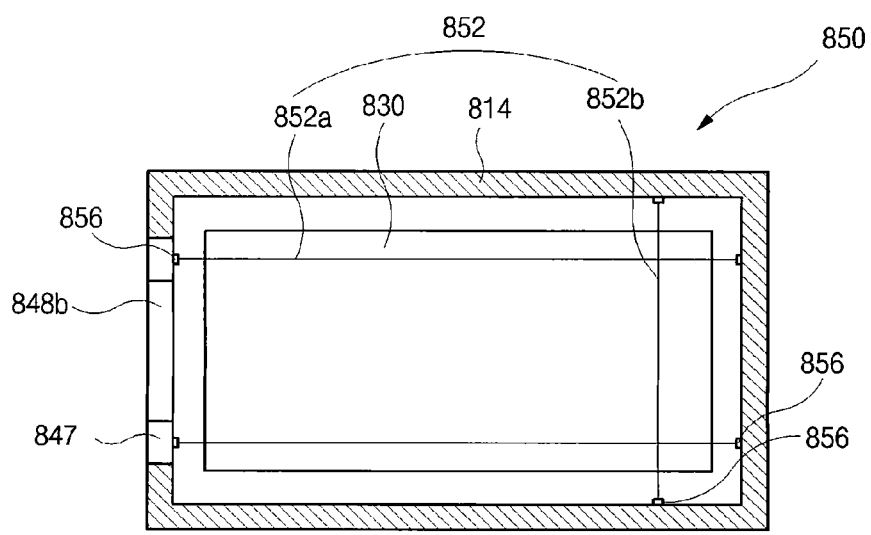

FIGS. 16A and 16B are schematic perspective and plane views showing a substrate supporting unit in a plasma apparatus according to another exemplary embodiment of the present invention.

In FIGS. 16A and 16B, a substrate supporting unit 850 includes a plurality of wires 852 and a plurality of wire terminals 856. The plurality of wires 852 includes first wires 852a parallel to long sides of a susceptor 830 and second wires 852b parallel to short sides of the susceptor 830. Accordingly, the first and second wires 852a and 852b cross each other and are horizontally disposed over the susceptor 830. Each wire 852 is fixed to a sidewall of a chamber body 814 through the wire terminals 856.

A slot valve 846 having a T-shape is formed on the sidewall of the chamber body 814. Accordingly, a width of an upper portion 848a of the slot valve 846 is greater than a width of a lower portion 848b of the slot valve 846, and two auxiliary sidewalls 847 are formed at the lower portion 848b of the slot valve 846. Since a robot arm 860 (of FIG. 17A) having a substrate "S" (of FIG. 17A) thereon moves into and out of a process chamber through the upper portion 848a of the slot valve 846, the upper portion 848a has a width corresponding to the substrate "S" (of FIG. 17A). In addition, since only the robot arm 860 (of FIG. 17A) moves up and down through the lower portion 848b, the lower portion may have a width corresponding to the robot arm 860 (of FIG. 17A) narrower than the substrate "S" (of FIG. 17A). In another embodiment, the lower portion may have a triangular shape such that a width of the lower portion decreases along a downward direction. The ends of the first wires 852a may be fixed to the auxiliary sidewalls 847 so that a distance between the slot valve 846 and the first wires 852a can be automatically adjusted.

FIGS. 17A to 17F are schematic cross-sectional views showing a method of transferring a substrate in a plasma apparatus according to another exemplary embodiment of the present invention. Even though FIGS. 17A to 17F corresponds to a substrate supporting unit of FIGS. 13, 14A and 14B, the method of transferring a substrate of FIGS. 17A to 17F may be applied to a substrate supporting unit of FIGS. 15A, 15B, 16A and 16B.

Figure 17A:
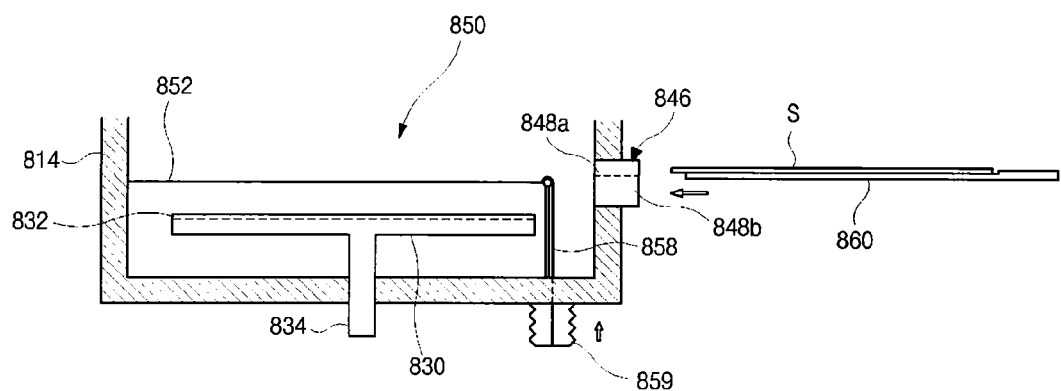
FIGS. 17A to 17F are schematic cross-sectional views showing a method of transferring a substrate in a plasma apparatus according to another exemplary embodiment of the present invention.

In FIG. 17A, the robot arm 860 having the substrate "S" thereon is inserted into the process chamber through the upper portion 848a of the slot valve 846. The substrate supporting unit 850 including the plurality of wires 852 and the susceptor 830 are formed in the process chamber. In addition, the plurality of wires 852 are connected to the tension controlling unit 859 through a bottom of the chamber body 814.

Figure 17B:
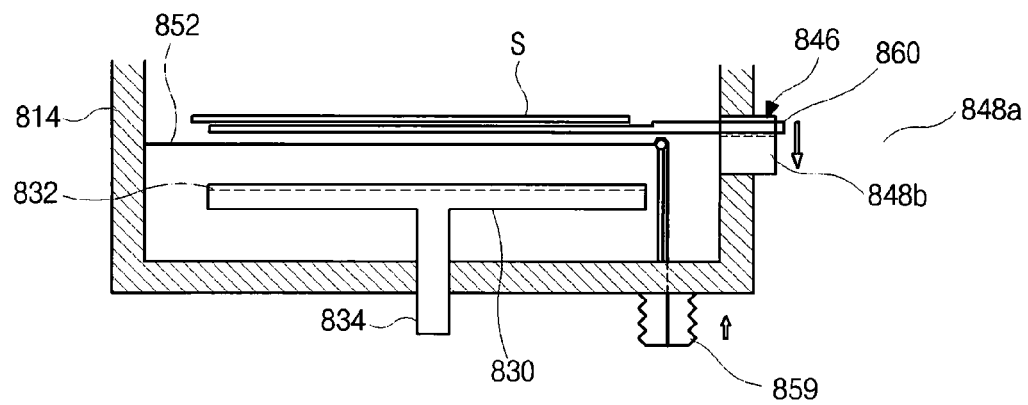

In FIG. 17B, the robot arm 860 having the substrate "S" thereon is disposed at a central portion of the process chamber over the susceptor 830 and the plurality of wires 852 of the substrate supporting unit 850. The plurality of wires 852 are separated from the substrate "S" and the susceptor 830. Then, the robot arm 860 having the substrate "S" moves down.

Figure 17C:
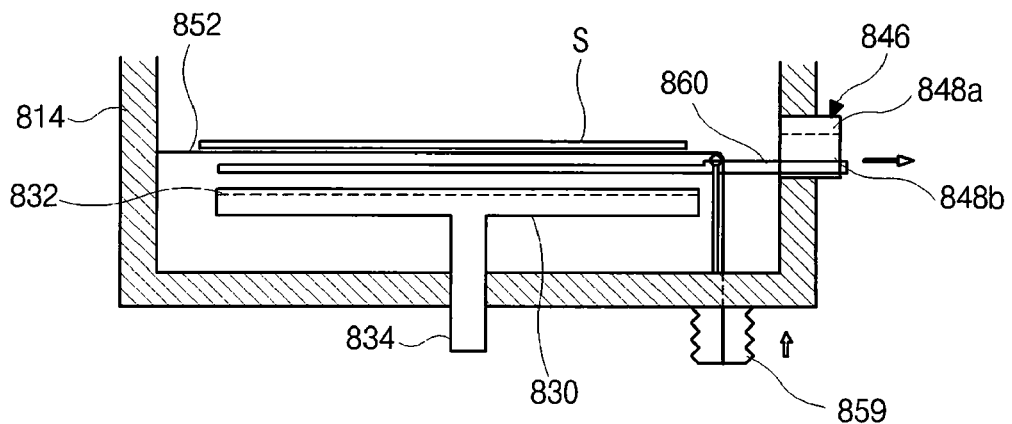

In FIG. 17C, since a gap between the plurality of wires 852 is wider than the robot arm 860, the plurality of wires 852 contacts the substrate "S" without contacting the robot arm 860. As the robot arm 860 further moves down, the robot arm 860 is separated from the substrate "S" and the substrate "S" is supported by the plurality of wires 852.

Figure 17D:
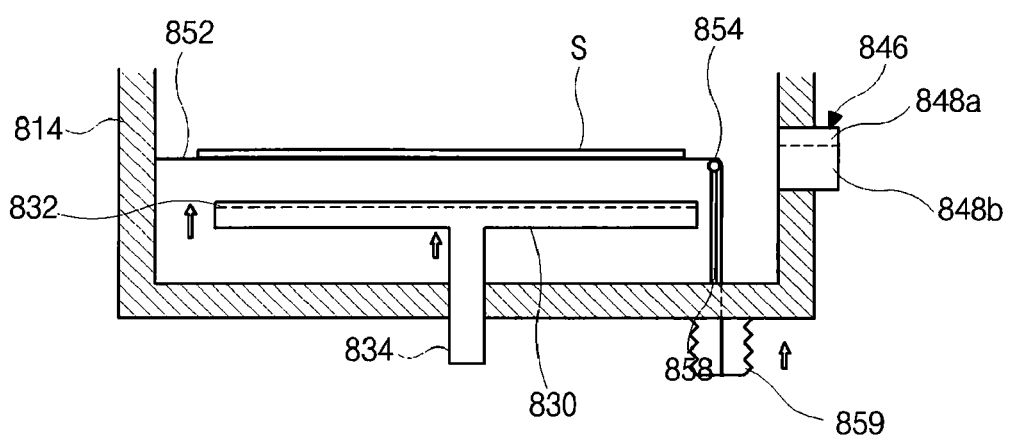

In FIG. 17D, the robot arm 860 moves out of the process chamber through the lower portion 848b.

Figure 17E:
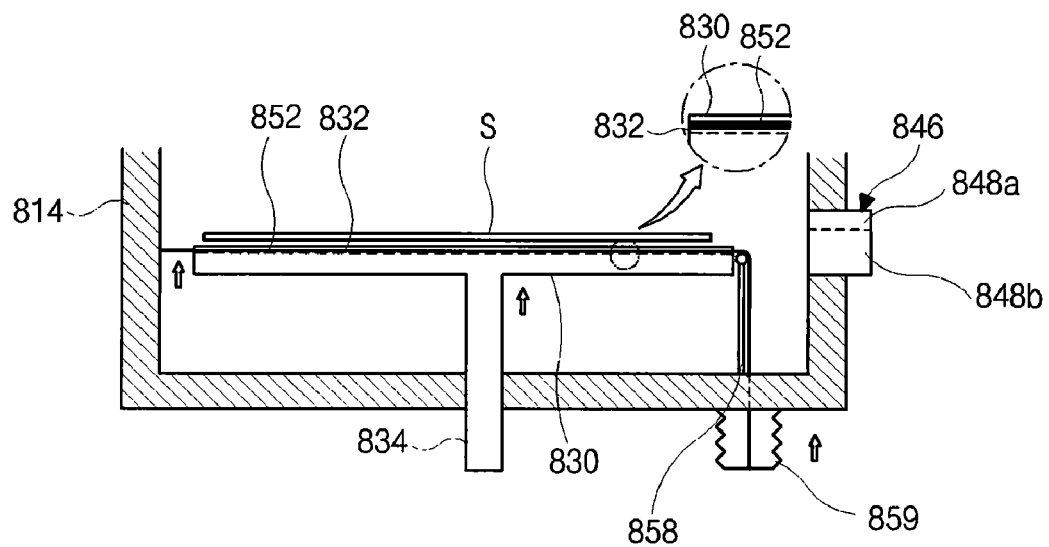

In FIG. 17E, the susceptor 830 moves up to contact the plurality of wires 852. Since the susceptor 860 includes a plurality of wire grooves 832, the plurality of wires 852 are completely inserted into the plurality of wire grooves 832 of the susceptor 830. Accordingly, the substrate "S" uniformly contacts the susceptor 830 to be supported by the susceptor 830. The tension of the plurality of wires 852 is not adjusted by the tension controlling unit 859 until the susceptor 830 contacts the substrate "S."

Figure 17F:
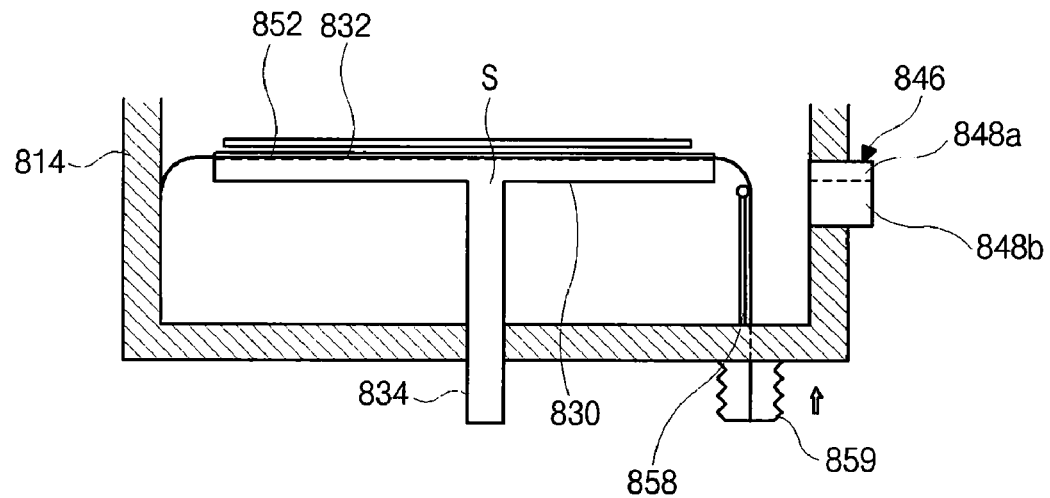

In FIG. 17F, the susceptor 830 having the substrate "S" thereon further moves up. Since the plurality of wires 852 in the plurality of wire grooves 832 also moves up with the susceptor 830, the plurality of wires 852 may be expanded to change the tension of the plurality of wires 852. Accordingly, the tension controlling unit 859 adjust the tension of the plurality of wires 852 to prevent a break of the plurality of wires 852 and a defect of the substrate "S" due to the plurality of wires 852. For example, when the susceptor 830 having the substrate "S" thereon moves up, the tension controlling unit 859 of a bellows type may contract to keep an optimum tension of the plurality of wires 852. Substantially, a length of the plurality of wires 852 in the process chamber increases. Even though not shown in FIG. 17F, the tension controlling means 859 and the susceptor 830 may be operated independently or simultaneously.

Next, the source gases are excited to a plasma state and are deposited on the substrate "S" to form a thin film. After forming the thin film, the substrate "S" having the thin film thereon is transferred out of the process chamber through a procedure reverse to the procedure shown in FIGS. 17A to 17F. After the thin film is formed on the substrate "S," the susceptor 830 having the substrate "S" thereon moves down and the tension controlling means 859 adjust the tension of the plurality of wires 852. For example, the tension controlling means 859 of a bellows type may expand to keep an optimum tension of the plurality of wires 852, thereby a length of the plurality of wires 852 in the process chamber substantially decreasing. Next, as the susceptor 830 further moves down, the plurality of wires 852 are separated from the susceptor 830 to support the substrate "S." Next, the robot arm 860 moves into the process chamber through the lower portion 848b of the slot valve 846 and is disposed between the substrate "S" and the susceptor 830. Then, the robot arm 860 moves up to contact the substrate "S" and the plurality of wires 852 are separated from the substrate "S." As a result, the substrate "S" is supported by the robot arm 860. Next, the robot arm 860 having the substrate "S" thereon moves out of the process chamber through the upper portion 848a of the slot valve 846.

Figure 18:
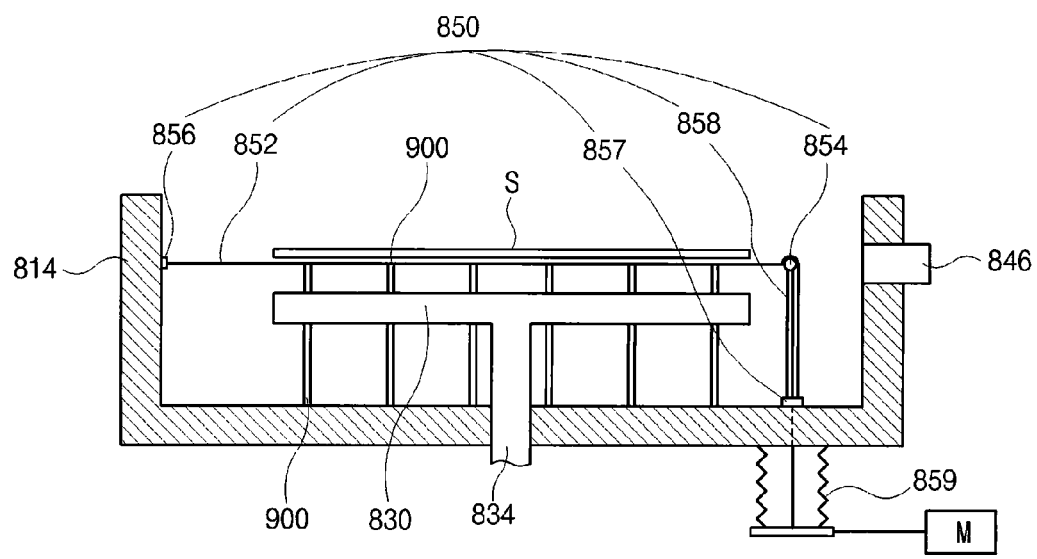
FIGS. 18 and 19 are schematic cross-sectional and plane views, respectively, showing a substrate supporting unit in a plasma apparatus according to another exemplary embodiment of the present invention.
Figure 19:
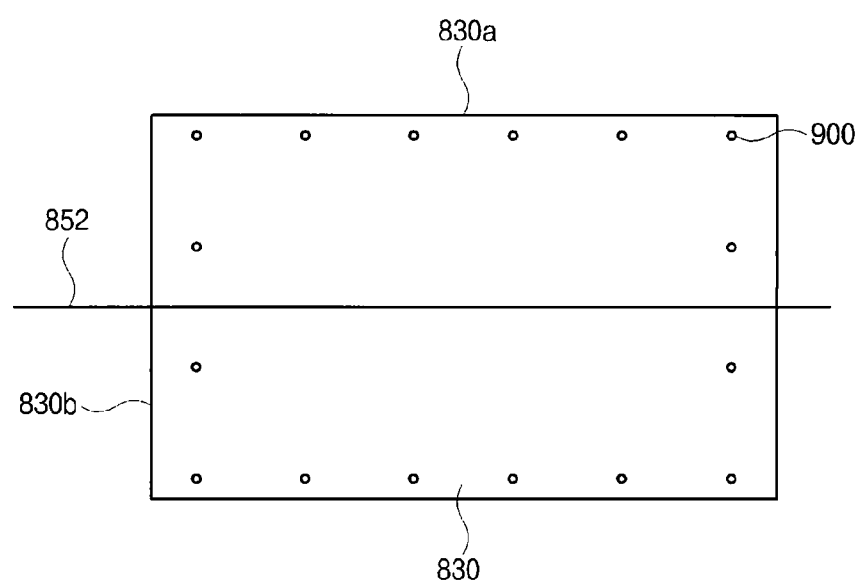

FIGS. 18 and 19 are schematic cross-sectional and plane views, respectively, showing a substrate supporting unit in a plasma apparatus according to another exemplary embodiment of the present invention.

In FIGS. 18 and 19, a substrate supporting unit 850 includes a wire 852 crossing a central portion of a susceptor 830, a direction changing means 854, a direction changing means supporter 858, a first wire terminal 856, a second wire terminal 857 and a plurality of lift pins 900. The wire 852 horizontally extends over the susceptor 830. Since the horizontal direction of the wire 852 is changed into a vertical direction by the direction changing means 854, the wire 852 vertically extends outside the susceptor 830. The direction changing means 854 may be supported by the direction changing means supporter 858. A first end of the wire 852 is connected to a sidewall of a chamber body 814 through the first wire terminal 856 and a second end of the wire 852 is connected to a tension controlling unit 859 through the second wire terminal 857.

The plurality of lift pins 900 correspond to a boundary portion of the susceptor 930, while the wire 852 corresponds to a central portion of the susceptor 830. In addition, the wire is parallel to a long side 830a of the susceptor 830. Accordingly, a substrate "S" is supported by the plurality of lift pins 900 at a boundary portion of the substrate "S" and the wire 852 at a central portion of the substrate "S." The plurality of lift pins 900 may be formed of ceramic or stainless steel.

FIGS. 20A to 20F are schematic cross-sectional views showing a method of transferring a substrate in a plasma apparatus having a substrate supporting unit of FIGS. 18 and 19.

Figure 20A:
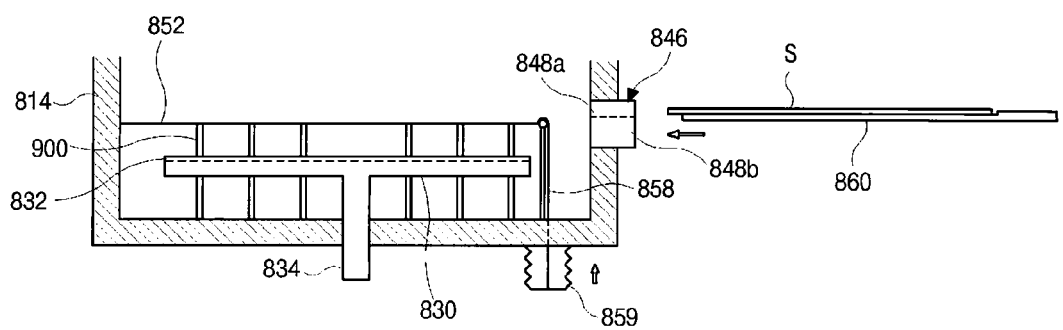
FIGS. 20A to 20F are schematic cross-sectional views showing a method of transferring a substrate in a plasma apparatus having a substrate supporting unit of FIGS. 18 and 19.

In FIG. 20A, the robot arm 860 having the substrate "S" thereon is inserted into the process chamber through the upper portion 848a of the slot valve 846. The substrate supporting unit 850 including the wire 852 and the plurality of lift pins 900 and the susceptor 830 are formed in the process chamber. In addition, the wire 852 is connected to the tension controlling unit 859 through a bottom of the chamber body 814. Even though not shown in FIG. 20A, the wire 852 corresponds to the central portion of the substrate "S" and the plurality of lift pins 900 correspond to the boundary portion of the substrate "S." Furthermore, the wire 852 has substantially the same height as the top surface of the plurality of lift pins 900.

Figure 20B:
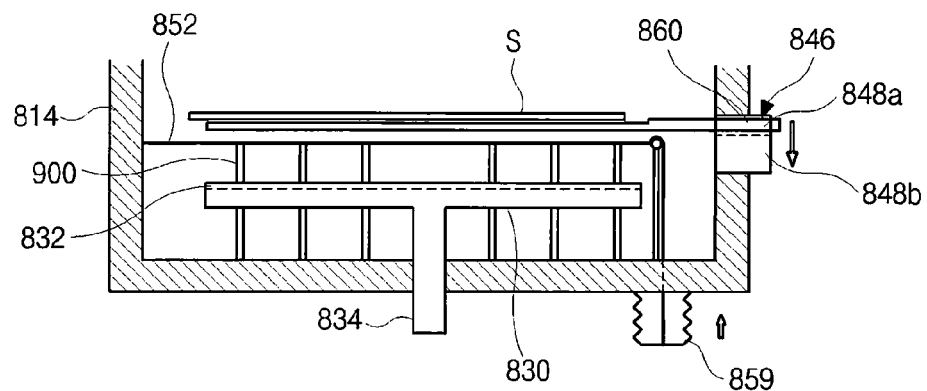

In FIG. 20B, the robot arm 860 having the substrate "S" thereon is disposed at a central portion of the process chamber over the susceptor 830, the plurality of wire 852 of the substrate supporting unit 850 and the plurality of lift pins 900 protruded above the susceptor 830. The wire 852 and the plurality of lift pins 900 are separated from the substrate "S." Then, the robot arm 860 having the substrate "S" thereon moves down.

Figure 20C:
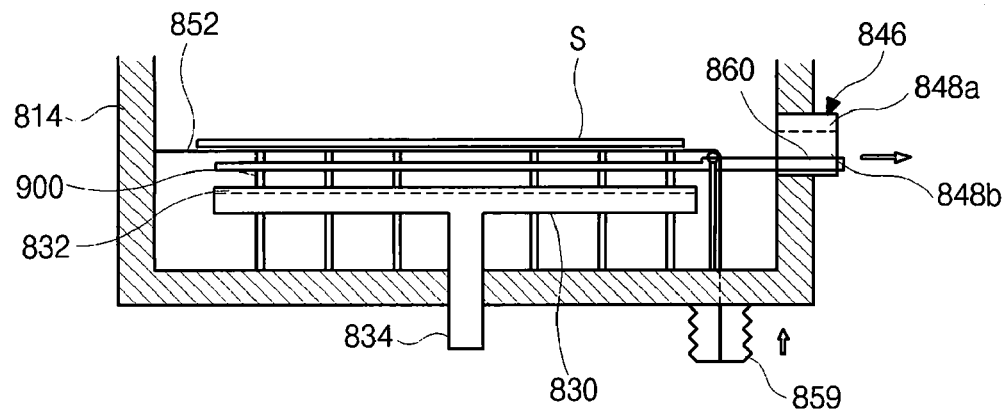

In FIG. 20C, since a gap between the plurality of lift pins 900 is wider than the robot arm 860, the plurality of lift pins 900 contact the substrate "S" without contacting the robot arm 860. As the robot arm 860 further moves down, the robot arm 860 is separated from the substrate "S" and the substrate "S" is supported by the wire 852 and the plurality of lift pins 900.

Figure 20D:
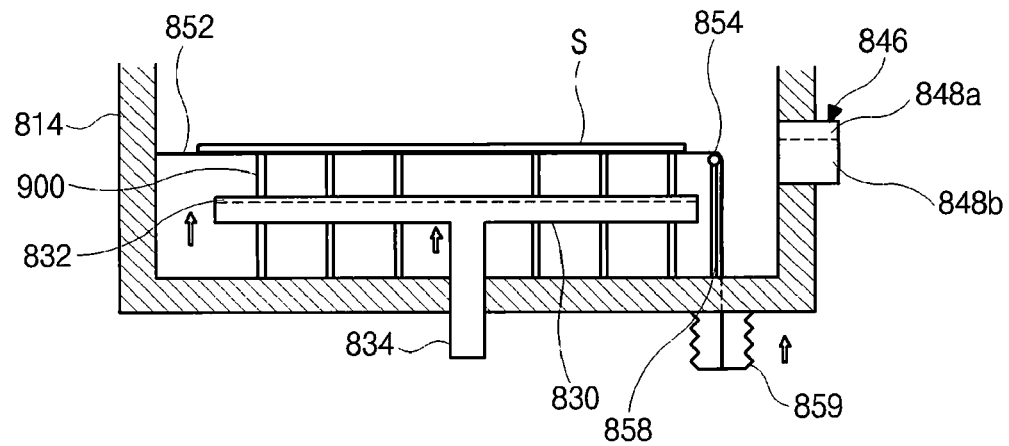

In FIG. 20D, the robot arm 860 moves out of the process chamber through the lower portion 848b of the slot valve 846.

Figure 20E:
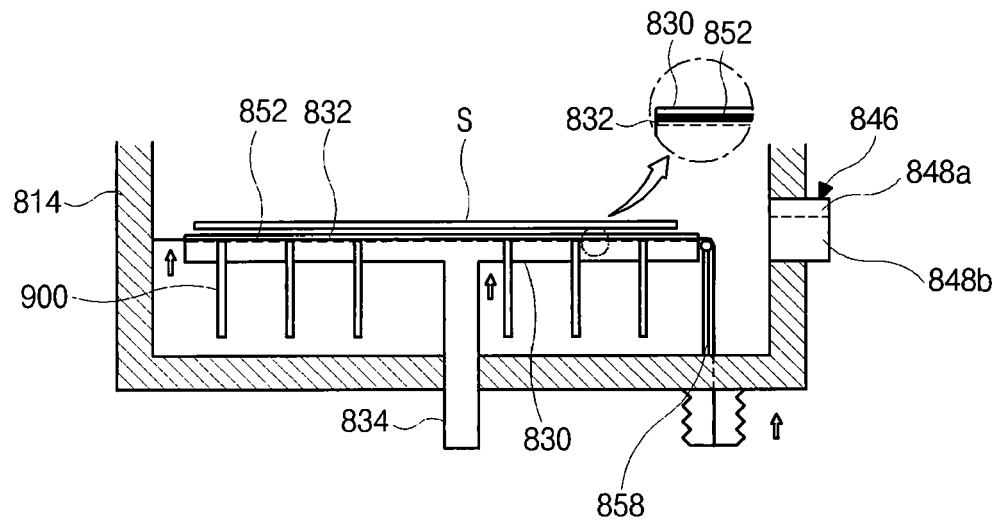

In FIG. 20E, the susceptor 830 moves up to contact the wire 852. Since the susceptor 860 includes a wire groove 832, the wire 852 is completely inserted into the wire groove 832 of the susceptor 830. In addition, the plurality of lift pins 900 relatively moves down through a plurality of lift pin holes (not shown) in the susceptor 830. Accordingly, the substrate "S" uniformly contacts the susceptor 830 and is safely supported by the susceptor 830. The tension of the plurality of wires 852 is not adjusted by the tension controlling unit 859 until the susceptor 830 contacts the substrate "S."

Figure 20F:
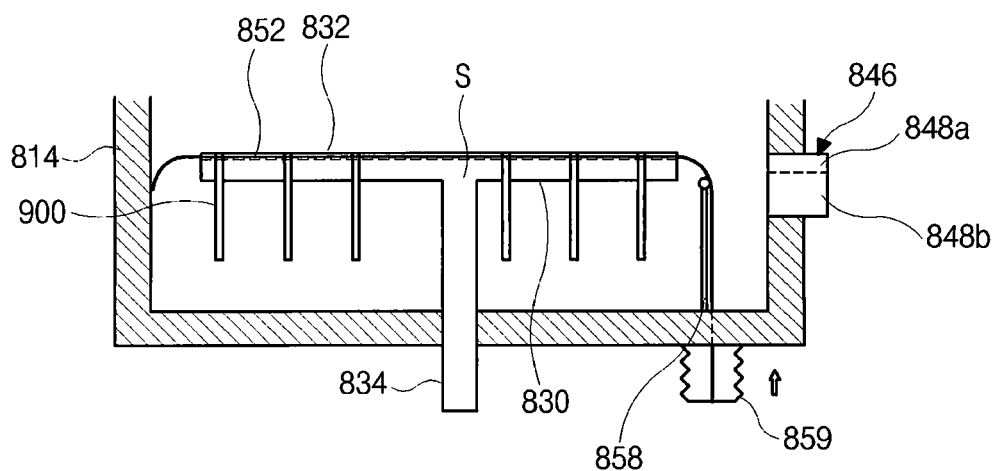

In FIG. 20F, the susceptor 830 having the substrate "S" thereon further moves up. Since the wire 852 in the wire groove 832 also moves up with the susceptor 830, the wire 852 may be expanded to change the tension of the wire 852. Accordingly, the tension controlling unit 859 adjust the tension of the wire 852 to prevent a break of the wire 852 and a defect of the substrate "S" due to the wire 852. For example, when the susceptor 830 having the substrate "S" thereon moves up, the tension controlling unit 859 of a bellows type may contract to keep an optimum tension of the wire 852. Substantially, a length of the wire 852 in the process chamber increases. Even though not shown in FIG. 20F, the tension controlling means 859 and the susceptor 830 may be operated independently or simultaneously. The plurality of lift pins 900 move up together with the susceptor 830.

Next, the source gases are excited to a plasma state and are deposited on the substrate "S" to form a thin film. After forming the thin film, the substrate "S" having the thin film thereon is transferred out of the process chamber through a procedure reverse to the procedure shown in FIGS. 20A to 20F. After the thin film is formed on the substrate "S," the susceptor 830 having the substrate "S" thereon moves down and the tension controlling means 859 adjust the tension of the wire 852. For example, the tension controlling means 859 of a bellows type may expand to keep an optimum tension of the wire 852, thereby a length of the wire 852 in the process chamber substantially decreasing. Next, as the susceptor 830 further moves down, the wire 852 is separated from the susceptor 830 and the plurality of lift pins 900 are protruded above the susceptor 830 to support the substrate "S."Next, the robot arm 860 moves into the process chamber through the lower portion 848b of the slot valve 846 and is disposed between the substrate "S" and the susceptor 830. Then, the robot arm 860 moves up to contact the substrate "S," and the wire 852 and the plurality of lift pins 900 are separated from the substrate "S." As a result, the substrate "S" is supported by the robot arm 860. Next, the robot arm 860 having the substrate "S" thereon moves out of the process chamber through the upper portion 848a of the slot valve 846.

In a plasma apparatus according to the present invention, a substrate supporting unit includes a plurality of wires and a susceptor includes a plurality of wire grooves corresponding to the plurality of wires. When the wires have the same number as the wire grooves, the wire grooves are formed in predetermined regions of the susceptor. The wire grooves in the predetermined regions of the susceptor may cause a poor uniformity in thickness of a thin film.

Figure 21A:
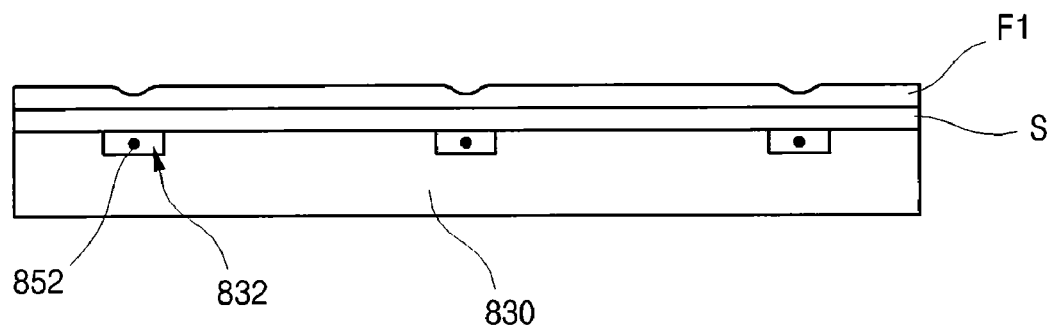
FIG. 21A is a schematic cross-sectional view showing a susceptor and a substrate in a plasma apparatus according to an exemplary embodiment of the present invention.
Figure 21B:
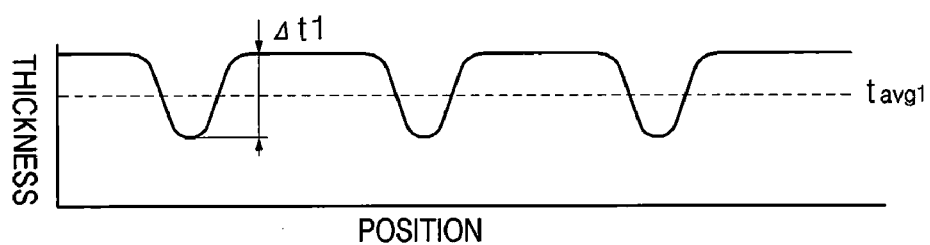
FIG. 21B is a graph showing a thickness of a thin film on a substrate of FIG. 21A.

FIG. 21A is a schematic cross-sectional view showing a susceptor and a substrate in a plasma apparatus according to an exemplary embodiment of the present invention and FIG. 21B is a graph showing a thickness of a thin film on a substrate of FIG. 21A.

In FIG. 21A, a substrate "S" is placed on a susceptor 830 having a plurality of wire grooves 832 and a plurality of wires 852 are inserted into the plurality of wire grooves 832. In regions of the plurality of wire grooves 832, the substrate "S" does not contact the susceptor 830 and is spaced apart from the susceptor 830. The substrate "S" is heated by a heater (not shown) in the susceptor 830 during a fabrication process. Since the substrate "S" does not perfectly contact the susceptor 830, a heat transmission at the regions of the plurality of wire grooves 832 is different from that at the other regions and a heat is not uniformly transmitted to the substrate "S." As a result, the substrate "S" has a poor uniformity in temperature.

Moreover, the susceptor 830 functions as a lower electrode to generate a plasma by using a gas dispersion unit (not shown) as an upper electrode. Since an equipotential line by an electrode of conductor is parallel to an outer surface of the electrode, the equipotential line by the susceptor 830 has an uneven shape corresponding to a top surface of the susceptor 830. Accordingly, an electric field generated by the susceptor 830 and the gas dispersion unit is not uniform and a plasma density by the electric field is not uniform, either.

As shown in FIG. 21B, the poor uniformity in temperature of substrate "S" and density of plasma result in a thickness difference of a thin film "F1" on the substrate "S." A thickness of the thin film "F1" corresponding to the plurality of wire grooves 832 (of FIG. 21A) is smaller than a thickness of the thin film "F1" corresponding to the other regions. When the thin film "F1" has a thickness difference of $\Delta t1$ and an average thickness of $t_{avg1}$, the uniformity of the thin film "F1" may be defined as an equation of $U(\%)=(\Delta t1/2t_{avg1})\times100$.

Figure 22:
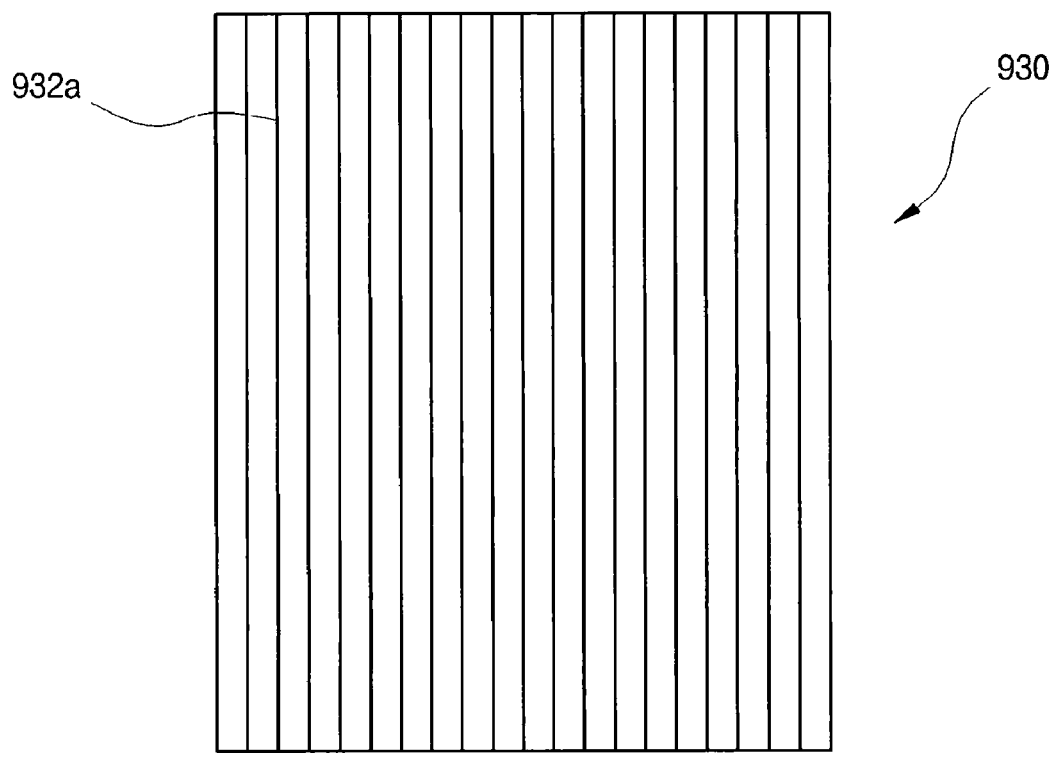
FIGS. 22 and 23 are schematic plane views showing a susceptor of a plasma apparatus according to another embodiment of the present invention.
Figure 23:
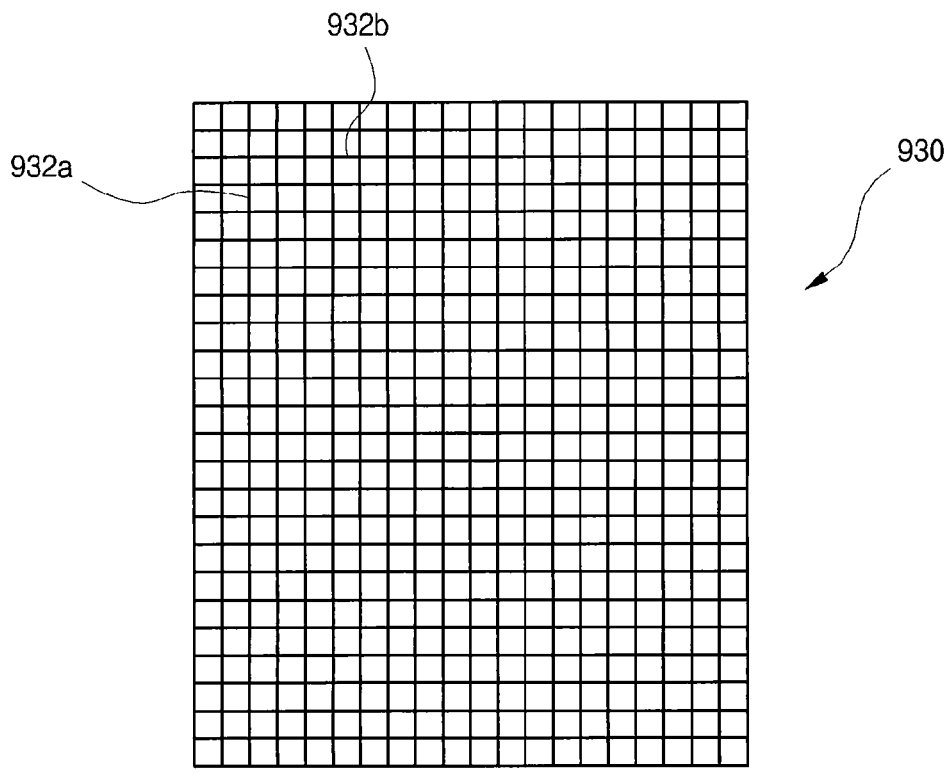

FIGS. 22 and 23 are schematic plane views showing a susceptor of a plasma apparatus according to another embodiment of the present invention.

In FIGS. 22 and 23, a susceptor 930 has a plurality of wire grooves 932, 932a and 932b on a top surface thereof, and the plurality of wire grooves 932, 932a and 932b has a number greater than a plurality of wires (not shown). Accordingly, the plurality of wires are inserted into some of the plurality of wire grooves 932, 932a and 932b. The plurality of wire grooves 932, 932a and 932b are substantially equally spaced apart from each other, and are formed on the entire top surface of the susceptor 930. As a result, the plurality of wire grooves 932, 932a and 932b are uniformly formed on the top surface of the susceptor 930, thereby improving the thickness uniformity of the thin film. The plurality of wire grooves 932 are formed to be parallel to a long side of the susceptor 930 in FIG. 22, while the plurality of first wire grooves 932a are formed to be parallel to a long side of the susceptor 930 and the plurality of second wire grooves 932b are formed to be parallel to a short side of the susceptor 930.

Figure 24A:
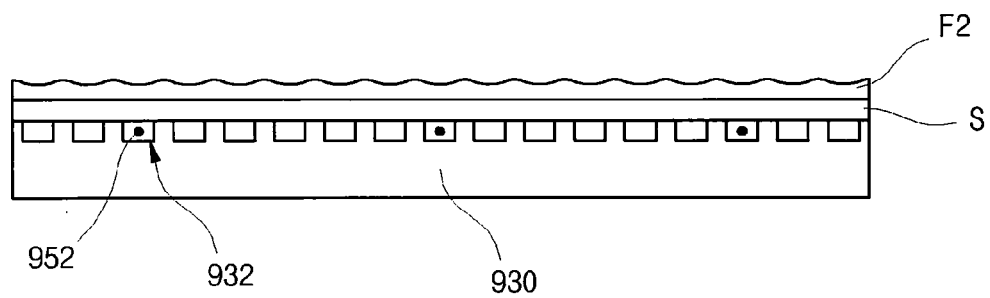
FIG. 24A is a schematic cross-sectional view showing a susceptor and a thin film of a plasma apparatus according to another embodiment of the present invention.
Figure 24B:
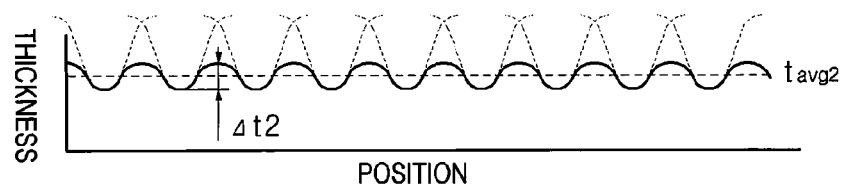
FIG. 24B is a graph showing a thickness of a thin film on a substrate of FIG. 24B.

FIG. 24A is a schematic cross-sectional view showing a susceptor and a thin film of a plasma apparatus according to another embodiment of the present invention and FIG. 24B is a graph showing a thickness of a thin film on a substrate of FIG. 24B.

In FIG. 24A, a substrate "S" is placed on a susceptor 930 having a plurality of wire grooves 932 and a plurality of wires 952 are inserted into some of the plurality of wire grooves 932. Accordingly, others of the plurality of wire grooves 932 may not include the plurality of wires 952. The substrate "S" in regions of the plurality of wire grooves 932 does not contact the susceptor 930 and is spaced apart from the susceptor 930, while the substrate "S" in the other regions contacts the susceptor. The plurality of wire grooves 932 are substantially equally spaced apart from each other, and are formed on the entire top surface of the susceptor 930.

The substrate "S" is heated by a heater (not shown) in the susceptor 930 during a fabrication process. Even though the substrate "S" does not entirely contact the susceptor 930, a heat transmission from the heater to the substrate "S" and a plasma density are uniform because the plurality of the wire grooves 932 are formed on the entire surface of the susceptor 930 and are equally spaced apart from each other. As a result, a thickness uniformity of a thin film "F2" is improved.

As shown in FIG. 24B, the thin film "F2" has a plurality of concave portions due to the plurality of wire grooves 932. The concave portion is wider than the wire groove 932 and the plurality of wire grooves 932 are spaced apart from each other such that the plurality of concaves overlap each other. Accordingly, a thickness difference of $\Delta t2$ of the thin film "F2" is reduced. As a result, a thickness uniformity of the thin film "F2," which may be defined as an equation of $U(\%)=(\Delta t2/2t_{avg2})\times100$, is improved. When the plurality of wire grooves 932 are formed on an entire surface of the susceptor 930 and are equally spaced apart from each other such that a plurality of concave portions of the thin film "F2" overlap each other, a thickness uniformity is improved. A width of each wire groove 932 and a distance between the adjacent wire grooves may be determined according to a susceptor size and a number of the wire grooves. For example, a width of each wire may be within a range of about 1 mm to about 2 mm, and a distance between the adjacent wire grooves 932 may be over about 1 mm.

In addition, when the plurality of wire grooves 932 are more than the plurality of wire 952, there exists another advantages. Since the susceptor 930 is heated up during a fabrication process, the susceptor 930 may contract or expand. Even though a first wire groove is disposed to correspond to a first wire, the first wire groove does not correspond to the first wire any more after the susceptor 930 contracted or expand. However, since the plurality of wire grooves 932 are more than the plurality of wires 952, the first wire may correspond to a second wire groove adjacent to the first wire groove. Accordingly, the plurality of wires 952 are inserted into the plurality of wire grooves even when the susceptor 930 contract or expand.

Figure 25A:
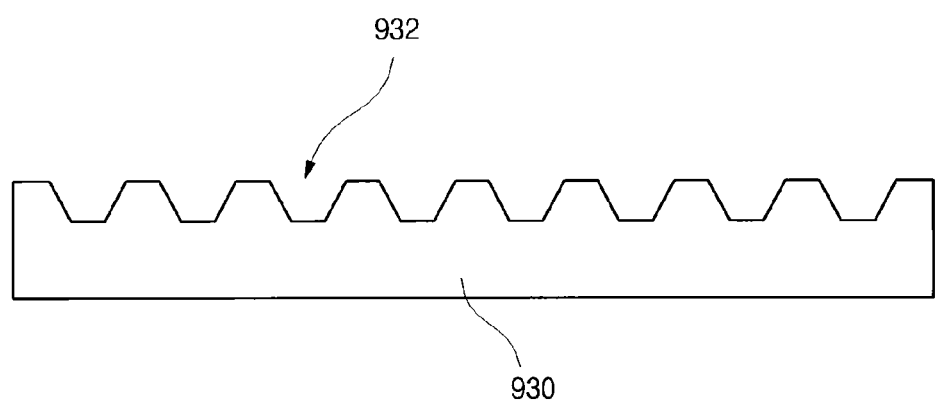
FIGS. 25A and 25B are schematic cross-sectional views showing a plurality of wire grooves in a susceptor of a plasma apparatus according to another exemplary embodiment of the present invention.
Figure 25B:
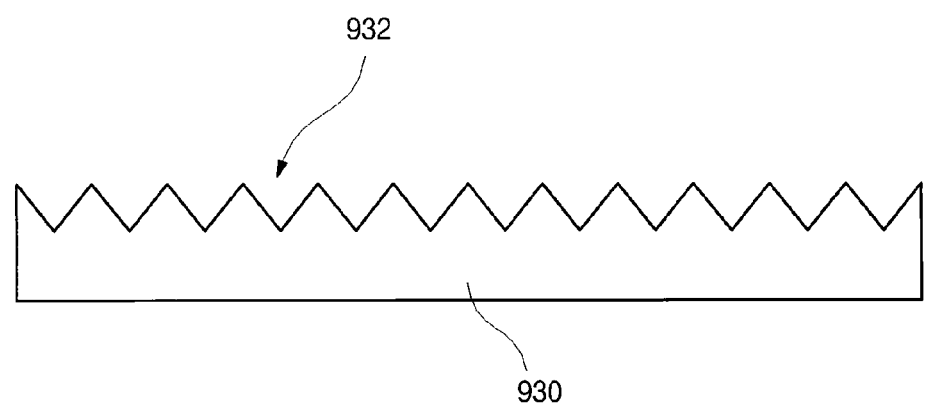

A plurality of wires having an improved shape will be illustrated with reference to FIGS. 25A and 25B. FIGS. 25A and 25B are schematic cross-sectional views showing a plurality of wire grooves in a susceptor of a plasma apparatus according to another exemplary embodiment of the present invention.

In FIGS. 25A and 25B, a plurality of wire grooves 932 are formed on a top surface of a susceptor 930. The wire groove 932 does not have a rectangular shape but a trapezoidal shape or a triangular shape in cross-sectional view. Since a sidewall of the wire groove 932 is slanted, the wire 952 may slide into the wire groove 932 even when the wire groove 932 is shifted due to contraction or expansion of the susceptor 930. Accordingly, a misalignment between the wire 952 and the wire groove 932 and an incomplete insertion of the wire 952 into the wire groove 932 are improved.

In a plasma apparatus according to the present invention, a substrate supporting unit stably supports a substrate by using a plurality of wires or using a plurality of wires and a plurality of pins. Accordingly, a thickness uniformity of a thin film on a substrate is improved.

It will be apparent to those skilled in the art that various modifications and variations can be made in the apparatus having a conveyor without departing from the spirit or scope of the invention. Thus, it is intended that the present invention covers the modifications and variations of this invention provided they come within the scope of the appended claims and their equivalents.

What is claimed is:

1. A method of transferring a substrate in an apparatus, the method comprising;
   a) moving a robot arm having the substrate thereon into a process chamber of the apparatus, the robot arm being disposed over a supporting frame, at least one wire connected to the supporting frame, and a susceptor under the supporting frame in the process chamber, wherein the supporting frame includes an open portion for the robot arm to move into and out of the supporting frame;

b) moving down the robot arm such that the substrate is supported by the at least one wire;

c) moving the robot arm out of the process chamber; and d) moving up the susceptor such that the substrate is supported by the susceptor.

2. The method according to claim 1, further comprising: e) moving up the susceptor having the substrate thereon such that an edge frame covers a boundary portion of the substrate.

3. The method according to claim 2, wherein the step of e) includes simultaneously moving up the supporting frame with the susceptor.

4. The method according to claim 1, wherein the supporting frame includes a supporting frame terminal for supporting the supporting frame.

5. The method according to claim 1, wherein the at least one wire includes first wires parallel to a long side of the substrate and second wires parallel to a short side of the substrate.

6. The method according to claim 1, wherein the susceptor includes at least one wire groove on a top surface thereof.

7. The method according to claim 1, wherein the at least one wire groove has substantially the same number as the least one wire.

8. The method according to claim 1, wherein the at least one wire groove has a number greater than the at least one wire.

9. The method according to claim 1, wherein the at least one wire is the plurality of wire grooves that are spaced apart from each other by a substantially equal distance and disposed on an entire surface of the susceptor.

10. The method according to claim 1, wherein the at least one wire groove has one of a rectangular shape, a trapezoidal shape and a triangular shape in a cross-sectional view.

11. The method according to claim 1, wherein the at least one wire is formed of one of stainless steel including one of chromium (Cr) and nickel (Ni), inconel alloy, monel alloy, hastelloy alloy, piano steel and high carbon piano steel.

12. The method according to claim 1, wherein the plurality of lift pins are installed at the susceptor and wherein a central portion of the substrate is supported by the at least one wire and a boundary portion of the substrate is supported by the plurality of lift pins in the step of b).

13. The method according to claim 1, wherein the supporting frame includes:

a first portion;

a second portion coupled to the first portion;

a third portion coupled to the second portion and spaced apart from the first portion; and a fourth portion coupled to the first portion and the third portion, wherein the opening is defined within a central portion of the fourth portion such that sidewalls of the opening are spaced apart from the first portion and the third portion.

14. The method according to claim 13, wherein the at least one wire is connected to the second and fourth sides.

15. A method of transferring a substrate in an apparatus, comprising;

a) moving a robot arm having the substrate thereon into a process chamber of the apparatus, the robot arm being disposed over a supporting frame, a least one wire connected to the supporting frame, and a susceptor under the supporting frame in the process chamber, wherein the supporting frame includes an intended portion for the robot arm to move into and out of the supporting frame;

b) moving down the robot arm such that the substrate is supported by the at least one wire;

c) moving the robot arm out of the process chamber; and d) moving up the susceptor such that the substrate is supported by the susceptor.

16. The method according to claim 15, further comprising e) moving up the susceptor having the substrate thereon such that an edge frame covers a boundary portion of the substrate.

17. The method according to claim 16, wherein the process chamber includes:

a first fixing means for placing the supporting frame; and a second fixing means for placing the edge frame.

18. The method according to claim 15, wherein the step of e) includes simultaneously moving up the supporting frame with the susceptor.

19. The method according to claim 15, wherein the supporting frame includes:

a first portion;

a second portion coupled to the first portion;

a third portion coupled to the second portion and spaced apart from the first portion; and a fourth portion coupled to the first portion and the third portion, wherein the fourth portion comprises:

a boundary upper portion coupled to one of the first and third portions;

a central upper portion spaced apart from the boundary upper portion;

connecting portion coupled to the boundary and central upper portions; and a lower portion coupled to the connecting portions, wherein the lower portion is lower than the boundary and central upper portions.

20. The method according to claim 19, wherein the at least one wire is connected to the second side and one of the boundary upper and center upper portions.

* * * * *